(12) United States Patent
Ogino et al.

(10) Patent No.: US 6,348,741 B1
(45) Date of Patent: Feb. 19, 2002

(54) SEMICONDUCTOR APPARATUS AND A MANUFACTURING METHOD THEREOF

(75) Inventors: Masahiko Ogino, Hitachi; Takao Miwa, Hitachinaka; Toshiya Satoh, Kanasagou-machi; Akira Nagai; Tadanori Segawa, both of Hitachi; Akihiro Yaguchi, Iwama-machi; Ichiro Anjo, Koganei; Asao Nishimura, Kokubunji; Takumi Ueno, Mito, all of (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/675,011

(22) Filed: Sep. 29, 2000

(30) Foreign Application Priority Data

Feb. 23, 2000 (JP) ......................................... 2000-052178

(51) Int. Cl.$^7$ .......................... H01L 23/48; H01L 23/52; H01L 29/40
(52) U.S. Cl. .......................... 257/782; 257/783; 438/118
(58) Field of Search ................................ 257/782, 783, 257/776; 438/118, 628, 623

(56) References Cited

U.S. PATENT DOCUMENTS

| 5,148,265 A | | 9/1992 | Khandros et al. |
| 5,892,288 A | * | 4/1999 | Muraki et al. |
| 5,917,235 A | * | 6/1999 | Imura |
| 6,011,315 A | * | 1/2000 | Toyasawa et al. |
| 6,034,437 A | * | 3/2000 | Shibata |
| 6,040,630 A | * | 3/2000 | Panchou et al. |
| 6,093,971 A | * | 7/2000 | Oppermann et al. |
| 6,191,490 B1 | * | 2/2001 | Huang et al. |
| 6,265,782 B1 | * | 7/2001 | Yamamoto et al. |

FOREIGN PATENT DOCUMENTS

| JP | 9232256 | 9/1997 |
| JP | 1027827 | 1/1998 |
| JP | 1092865 | 9/1998 |

* cited by examiner

Primary Examiner—Sheila V. Clark
(74) Attorney, Agent, or Firm—Antonelli, Terry, Stout & Kraus, LLP

(57) ABSTRACT

A manufacturing method makes it possible to produce a semiconductor apparatus which is outstanding in mounting reliability at a high manufacturing yield rate. A semiconductor apparatus, in which, on the surface of a semiconductor chip with a circuit and an electrode formed thereon, a stress cushioning layer is provided, except for a part where the electrode is, has a wiring layer connected to the electrode on the stress cushioning layer, an external protection film on the wiring layer and stress cushioning layer, a window where a part of the wiring layer is exposed at a predetermined location of the external protection film, and an external electrode which is electrically connected to the wiring layer via the window. The stress cushioning layer, wiring layer, conductor, external protection film, and external electrode are formed on the inside of the end of the semiconductor chip.

22 Claims, 5 Drawing Sheets

SEMICONDUCTOR APPARATUS AND A MANUFACTURING METHOD THEREOF

BACKGROUND OF THE INVENTION

The present invention relates to a semiconductor apparatus having a chip size package of the type used for a high density assembly module and a multi-chip module.

Recently, in association with the trend toward miniaturization and high performance of electronic devices, high density packing, high densification, and an increase in the speed of processing are also required for the semiconductor devices used therein. In correspondence with this objective, as a semiconductor apparatus mounting method, packages have been developed from the pin insertion type to the surface mounting type in order to increase the mounting density, and from a DIP (dual inline package) to a QFP (quad flat package) or a PGA (pin grid array) so as to correspond to the multi-pin type.

However, in the QFP type, the connection lead wires from the mounting substrate are centralized only in the peripheral part of the package, and the lead wires themselves are thin and deformable, so that, as the number of pins increases, the mounting has become more difficult. In the PGA type, the terminals to be connected to the mounting substrate are long and thin and centralized extremely, so that speeding up of the processing is difficult on an electric characteristic basis, and, since it is of a pin insertion type, surface mounting is not available and the type is disadvantageous in high density assembly.

Recently, to solve these problems and realize a semiconductor apparatus which is capable of high speed, a BGA (ball grid array) package has been developed which has a stress cushioning layer between a semiconductor chip and a substrate with a wiring circuit formed thereon, and a bump electrode is provided as an external terminal on the mounting substrate surface side of the substrate (U.S. Pat. No. 5,148,265). In a package having this structure, the terminals to be connected to the mounting substrate are ball-shaped solder, so that the lead wires are free of deformation, unlike the QFP type, and the terminals are scattered over all of the mounting surface. Hence, the pitch between the terminals can be made longer and the surface mounting is easy. The bump electrode, which is an external terminal, is shorter than that of the PGA type, so that the inductance component is small and the signal speed is fast. Hence, the structure can provide for high speed operation.

Recently, in association with wide spread use of portable information terminals, miniaturization and high density assembly of a semiconductor apparatus are required. Therefore, recently, a CSP (chip scale package) having a package size almost equal to the size of the chip has been developed. In "Nikkei Microdevice" (p. 38 to p. 64) issued by Nikkei BP, Ltd. (February 1998), various types of CSPs are disclosed. These CSPs are manufactured in such a way that semiconductor chips cut into pieces are adhered to a polyimide or ceramics substrate with a wiring layer formed thereon, and then the wiring layer and semiconductor chips are electrically connected by wire bonding, single point bonding, gang bonding, or bump bonding, and the connections are sealed with resin, and finally an external terminal, such as a solder bump is formed.

Japanese Patent Application Laid-open 9-232256 and Japanese Patent Application Laid-Open 10-27827 disclose methods for mass-producing CSPs. The methods form a bump on a semiconductor wafer, electrically connect a wiring substrate via the bump, then seal the connections with resin, form an external electrode on the wiring substrate, and finally cut it into pieces, in the manufacture of a semiconductor apparatus.

"Nikkei Microdevice" (p. 164 to p. 167) issued by Nikkei BP, Ltd. (April 1998) discloses another method for mass-producing CSPs. The method forms a bump on a semiconductor wafer by plating, seals the part other than the bump with resin, forms an external electrode in the bump part, and then cuts it into pieces, in the manufactures of a semiconductor apparatus.

Japanese Patent Application Laid-open 10-92865 discloses a semiconductor apparatus of a type having a resin layer for cushioning the stress between an external electrode and semiconductor chips, in which chips are processed in units of wafers in a batch and then cut into pieces.

SUMMARY OF THE INVENTION

In the aforementioned semiconductor apparatuses of the type wherein, after resin layers and external electrodes are formed, in a batch, in units of semiconductor wafers and the wafers are then cut into pieces, the interfaces of the layers are always exposed on the end face of the package. Therefore, due to the thermal stress caused by sudden temperature changes at the time of mounting the package and the mechanical stress at the time of the dicing of the chips into pieces, the stress is centralized on the interfaces between the chips and the resin layers which are exposed at the end of the package, and peeling is generated from there, so that the package is damaged. As a result, the reliability of the semiconductor apparatus is reduced, and the manufacturing yield rate also is reduced.

The present invention, with the foregoing in view, provides a semiconductor apparatus of high reliability and a semiconductor apparatus manufacturing method having a high manufacturing yield rate for preventing stress concentration on interfaces and suppressing peeling-off between chips and resin layers when thermal stress and mechanical stress are applied to a package.

The aforementioned problems can be solved by the features indicated below. The following is a summary of the features of the present invention.

(1) In a semiconductor apparatus having, on the surface of a semiconductor chip having a circuit and an electrode formed thereon, a stress cushioning layer on a part other than where the electrode is formed, a wiring layer connected to the electrode on the stress cushioning layer, an external protection film on the wiring layer and stress cushioning layer, a window where a part of the wiring layer is exposed at a predetermined location of the external protection film, and an external electrode which is electrically connected to the wiring layer via the window, wherein the stress cushioning layer, wiring layer, conductor, external protection film, and external electrode are formed on the inside of the end of the semiconductor chip.

(2) In a semiconductor apparatus having, on the surface of a semiconductor chip having a circuit and an electrode formed thereon, a chip protection film on a part other than where the electrode is formed, a first wiring layer and a stress cushioning layer connected to the electrode on the chip protection film, a second wiring layer connected to the first wiring layer on the stress cushioning layer, an external protection film on the second wiring layer and stress cushioning layer, a window where a part of the wiring layer is exposed at a predetermined location of the external protection film, and an external electrode which is electrically connected to the wiring layer via the window, wherein the chip protection film, stress cushioning layer, wiring layer, external protection film, and external electrode are formed on the inside of the end of the semiconductor chip.

(3) A semiconductor apparatus manufacturing method having 1. a step of forming a stress cushioning layer on a circuit forming surface of a semiconductor wafer on which a plurality of semiconductor elements are formed, 2. a step of forming an opening for exposing the chip electrode on the stress cushioning layer on an electrode of the semiconductor wafer, 3. a step of forming a slit in the stress cushioning layer on a scribe line for cutting the semiconductor wafer, 4. a step of forming a wiring layer connected to the electrode of the semiconductor chip on the stress cushioning layer via the opening, 5. a step of forming an external protection film having a window for connecting an external electrode on the stress cushioning layer and wiring layer except for the scribe line, 6. a step of forming an external electrode, and 7. a step of cutting the semiconductor wafer in a minimum unit for semiconductor apparatuses obtained after cutting to operate.

A semiconductor apparatus manufacturing method, wherein, instead of Step 5, there is 5(a). a step of forming a window for connecting an external electrode and an external protection film having an end on the inside of the end of the stress cushioning layer on the stress cushioning layer and wiring layer, or 5(b). a step of forming a window for connecting an external electrode and an external protection film having an end between the scribe line and the end of the stress cushioning layer on the stress cushioning layer and wiring layer.

(4) A semiconductor apparatus manufacturing method having 1. a step of forming a chip protection film on a circuit forming surface except wherein there is an electrode of a semiconductor wafer on which a plurality of semiconductor elements are formed and a scribe line for cutting the semiconductor wafer, 2. a step of forming a first wiring layer electrically connected to the electrode on the chip protection film, 3. a step of forming a stress cushioning layer on the chip protection film and first wiring layer, 4. a step of forming an opening for exposing a part of the wiring layer on the stress cushioning layer, 5. a step of forming a slit in the stress cushioning layer on the scribe line, 6. a step of forming a second wiring layer connected to a part of the first wiring layer on the stress cushioning layer via the opening formed in the stress cushioning layer, 7. a step of forming an external protection film having a window for connecting an external electrode on the stress cushioning layer and wiring layer except the scribe line, 8. a step of forming an external electrode, and 9. a step of cutting the semiconductor wafer in a minimum unit for semiconductor apparatuses obtained after cutting to operate.

A semiconductor apparatus manufacturing method, wherein, instead of Step 7, there is 7(a). a step of forming a window for connecting an external electrode and an external protection film having an end on the inside of the end of the stress cushioning layer on the stress cushioning layer and second wiring layer.

A semiconductor apparatus manufacturing method, wherein, after Step 1 and Step 2 mentioned above, there is 3. a step of forming a stress cushioning layer having an end on the inside of the end of the chip protection film on the chip protection film and first wiring layer, 4. a step of forming an opening for exposing a part of the first wiring layer on the stress cushioning layer, 5. a step of forming a second wiring layer connected to a part of the first wiring layer on the stress cushioning layer via the opening formed in the stress cushioning layer, 6. a step of forming a window for connecting an external electrode and an external protection film having an end on the inside of the end of the stress cushioning layer on the stress cushioning layer and second wiring layer, 7. a step of forming an external electrode, and 8. a step of cutting the semiconductor wafer into minimum units for semiconductor apparatuses to operate.

A semiconductor apparatus manufacturing method, wherein, after Step 1 and Step 2 mentioned above, there is 3. a step of forming a stress cushioning layer on the chip protection film and first wiring layer, 4. a step of forming an opening for exposing a part of the wiring layer on the stress cushioning layer, 5. a step of forming a slit so that the end of the stress cushioning layer is formed between the scribe line and the end of the chip protection film, 6. a step of forming a second wiring layer connected to a part of the first wiring layer on the stress cushioning layer via the opening formed in the stress cushioning layer, 7. a step of forming a window for connecting an external electrode and an external protection film having an end on the inside of the end of the stress cushioning layer on the stress cushioning layer and second wiring layer, 8. a step of forming an external electrode, and 9. a step of cutting the semiconductor wafer into minimum units for semiconductor apparatuses to operate.

A semiconductor apparatus manufacturing method, wherein, after Step I and Step 2 mentioned above, there is 3. a step of forming a stress cushioning layer having an end on the inside of the end of the chip protection film on the chip protection film and first wiring layer, 4. a step of forming an opening for exposing a part of the first wiring layer on the stress cushioning layer, 5. a step of forming a second wiring layer connected to a part of the first wiring layer on the stress cushioning layer via the opening formed in the stress cushioning layer, 6. a step of forming a window for connecting an external electrode and an external protection film having an end on the same surface as that of the end of the chip protection film on the stress cushioning layer and second wiring layer, 7. a step of forming an external electrode, and 8. a step of cutting the semiconductor wafer into minimum units for semiconductor apparatuses to operate.

A semiconductor apparatus manufacturing method, wherein, after Step 1 and Step 2 mentioned above, there is 3. a step of forming a stress cushioning layer having an end on the inside of the end of the chip protection film on the chip protection film and first wiring layer, 4. a step of forming an opening for exposing a part of the first wiring layer on the stress cushioning layer, 5. a step of forming a second wiring layer connected to a part of the first wiring layer on the stress cushioning layer via the opening formed in the stress cushioning layer, 6. a step of forming a window for connecting an external electrode and an external protection film having an end between the end of the chip protection film and the end of the stress cushioning layer on the stress cushioning layer and second wiring layer, 7. a step of forming an external electrode, and 8. a step of cutting the semiconductor wafer into minimum units for semiconductor apparatuses to operate.

A semiconductor apparatus manufacturing method, wherein, after Step 1 and Step 2 mentioned above, there is 3. a step of forming a stress cushioning layer on the chip protection film and first wiring layer, 4. a step of forming an opening for exposing a part of the wiring layer on the stress cushioning layer, 5. a step of forming a stress cushioning layer having an end between the scribe line and the end of the chip protection film, 6. a step of forming a second wiring layer connected to a part of the first wiring layer on the stress cushioning layer via the opening formed in the stress cushioning layer, 7. a step of forming a window for connecting an external electrode and an external protection film having an end between the end of the stress cushioning layer and the scribe line on the stress cushioning layer and second wiring layer, 8. a step of forming an external electrode, and 9. a step of cutting the semiconductor wafer into minimum units for semiconductor apparatuses to operate.

On the surface of each of semiconductor chips of the present invention, a semiconductor circuit of logic, memory, and gate array formed by a predetermined process and an electrode for sending and receiving electric signals to and from the outside are formed.

The stress cushioning layer is preferably made of a low elastic resin. For example, fluororubber, silicone rubber, silicone rubber fluoride, acrylic rubber, hydrogenated nitride rubber, ethylene propylene rubber, chlorosulfonated polystyrene, epichlorohydrin rubber, butyl rubber, urethane rubber, polycarbonate (PC)/acrylonitride-butadiene-styrene (ABS) alloy, polysiloxane diemethyl terephthalate (PCT)/polyethylene terephthalate (PET) interpolybutylene terephthalate (PBT)/polycarbonate (PC) alloy, polytetrafluoroethylene (PTFE), florinated ethylen propylene (FEP), polyarylate, polyamide (PA)/acrylonitride-butadiene-styrene (ABS) alloy, modified epoxy, modified polyolef in, and siloxane modified polyamide may be used.

In addition, there are various thermoset resins, such as epoxy resin, unsaturated polyester resin, epoxy isocyanate resin, maleimide resin, maleimide epoxy resin, cyanide ester resin, cyanide ester epoxy resin, cyanide ester maleimide resin, phenolic resin, diallyl phthalate resin, urethane resin, cyanamide resin, and maleimide cyanamide resin; and, a material with two or more kinds of the aforementioned resins combined, or a material with an inorganic filler mixed, may be used. It is also possible to give photosensitivity to the aforementioned resins and control the shape of the stress cushioning layer by a predetermined exposure and development process.

According to the present invention, the end of the aforementioned stress cushioning layer is formed on the inside of the end of the semiconductor chip. By doing this, compared with the interfaces exposed on the same surface, the stress between the semiconductor chip and the stress cushioning layer can be dispersed in a wider area, so that the stress is not centralized. As a result, the semiconductor chip is not easily peeled off from the stress cushioning layer.

Using a stress cushioning layer in which the thickness and coefficient of elasticity at room temperature are changed, a semiconductor apparatus according to the present invention was produced by way of a trial and was mounted in a mounting substrate, and the mounting reliability within the range from $-55°$ C. to $125°$ C. was evaluated. As a result, it was found that, assuming the thickness of the stress cushioning layer as t ($\mu$m) and the coefficient of elasticity at room temperature as E (MPa), when the relationship between the thickness and the coefficient of elasticity satisfies the following formula (1):

$$\log(t) \geq 0.988 \log(E) - 1.515 \quad (1)$$

the mounting reliability is satisfactory. In the same way, when the relationship between the thickness and the coefficient of elasticity does not satisfy the following formula (2):

$$\log(t) \leq -1.063 \log(E) + 4.839 \quad (2)$$

it is found that when each semiconductor wafer is to be processed independently, a warp is generated, and at the patterning step of the wiring layer forming process, a gap is generated between the semiconductor wafer and the patterning mask, so that a patterning failure is caused. Therefore, when a stress cushioning layer satisfying the relationship between the formulas (1) and (2) is applied, the yielding rate in the wiring layer forming process is increased.

From the above results, it can ben seen that it is desirable for the thickness and coefficient of elasticity of the stress cushioning layer of the present invention to satisfy the relationship between the formulas (1) and (2).

As a chip protection film, polyimide is generally used. However, if film forming is possible, there is no special limit to the material. A material with photosensitivity given may also be used. This chip protection film is also formed so that the end of the chip protection film is positioned on the inside of the end of the semiconductor chip in the same way as with the stress cushioning layer.

The wiring layer is formed on the chip protection film and stress cushioning layer using a conductor, such as gold, copper, or aluminum.

In a conductor layer formed between the wiring layer and the semiconductor chip, an opening is formed by exposure, development, and etching using a laser, such as a He—Ne laser, Ar laser, YAG laser, or carbonic acid gas laser or a photosensitive material. Thereafter, by a method for filling the opening with a conductive resin, wherein a conductive powder of carbon, graphite, gold, silver, copper, nickel, silver plated copper, or silver plated glass is mixed in a resin binder, such as epoxy resin, silicon resin, or polyimide resin, or a no-electric-field plating method, or a method for heat-depositing or sputter-depositing a metal, such as gold or copper in a vacuum, a conductive film is formed on the inner surface of the opening, and then a conductive layer is formed by electroplating.

Although there is no special limit to the external protection film, it is general to form a composition wherein an inorganic f iller is mixed in an organic compound, such as epoxy resin, polyimide resin, or polyamide resin, on the stress cushioning layer and wiring layer, except the connection part of the wiring layer and external electrode, by screen print. In this case, a material to which photosensitivity is given may be used. The external protection film, in the same way as with the aforementioned stress cushioning layer and chip protection film, is also formed so that the end of the external protection film is positioned on the inside of the end of the semiconductor chip.

The external electrode is a conductor for effecting electrical connection to a substrate on which a semiconductor apparatus is mounted; and, more specifically, it is a ball-shaped electrode of a solder alloy including tin, zinc, and lead, silver, copper, or gold, or any of them coated with gold. In addition, a terminal having a structure of an alloy with one or more of molybdenum, nickel, copper, platinum, and titanium combined or a multi-layer of two or more of them may be used.

DETAILED DESCRIPTION OF THE INVENTION

Various embodiments of the present invention will be explained hereunder with reference to the accompanying drawings.

[Embodiment 1]

Figure 1:
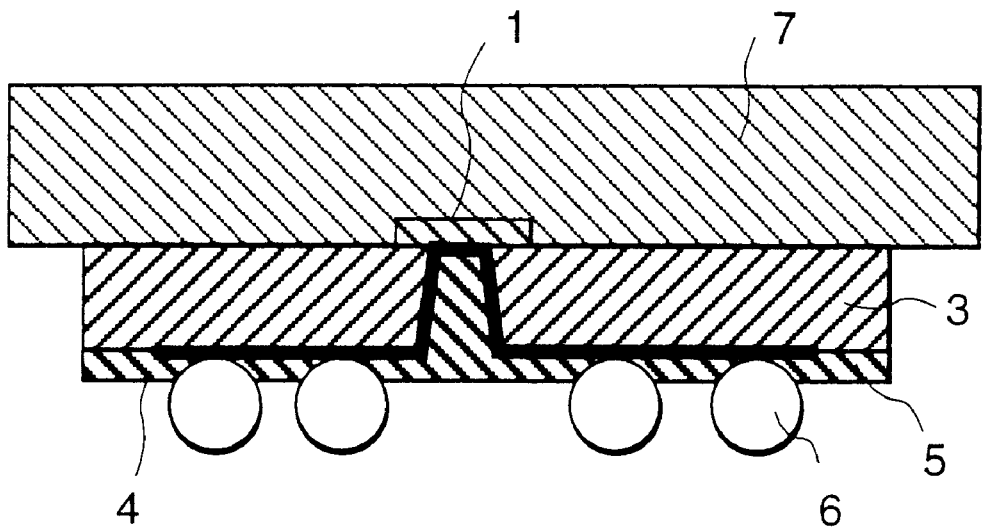
FIG. 1 is a cross sectional schematic view of a semiconductor apparatus representing an example of the present invention.

FIG. 1 is a cross sectional view of a semiconductor apparatus which represents an example of the present invention. The semiconductor apparatus was prepared by the following method.

On the surface of a silicone semiconductor wafer having a plurality of semiconductor elements and an Al electrode 1 formed on the surface thereof, a stress cushioning layer 3 was formed by adhering an uncured dry film with a thickness of 100 $\mu$m, including an epoxy resin, orthocresol novolac type curing agent, acrylic rubber, and silica filler, which has a coefficient of elasticity of 3000 MPa at room temperature after curing at 150° C. using a roll laminator, and then the film was heated and cured at 150° C. for one hour.

Next, in the stress cushioning layer, using a carbonic acid gas laser, an opening with a hole diameter of 50 $\mu$m and a 400-$\mu$m slit for exposing a 200-$\mu$m scribe line were formed. Next, in order to remove residues of the laser processing on the Al electrode and the oxide film on the surface of the Al electrode, oxygen plasma etching was executed. Next, on the surface of the stress cushioning layer 3, having with the opening and the linear slit formed therein, and in the opening, Cr to 500 Å in thickness and then Cu to 0.5 $\mu$m in thickness were deposited. On the deposited film obtained, a negative photosensitive resist (OFPR-N-3000, by Tokyo Oka Co., Ltd.) was spin-coated and a resist wiring pattern having a thickness of 15 $\mu$m was formed by prebaking, exposure, and development.

Next, a 10-$\mu$m Cu film was formed inside the wiring pattern by electroplating and a 2-$\mu$m Ni film was formed on the Cu film by electroplating. Next, the resist was peeled off using a release liquid (N-303C), and then the Cu deposited film was etched by an ammonium persulfate/sulfuric acid solution, and additionally Cr was etched by a potassium permanganate solution, whereby a wiring layer 4 was formed. At the stage of completion of this process, the failure rate of the wiring pattern was evaluated.

Next, on a wafer having the aforementioned wiring layer 4, photosensitive solder resist varnish (SR9000, by Hitachi Kasei Kogyo Co., Ltd.) was coated by a screen print process and the varnish is dried at 80° C. for 20 minutes. Thereafter, it was exposed and developed using a predetermined pattern and cured at 150° C. for one hour. On the wiring layer, an external protection film 5 having an opening for connecting an external electrode and having an end at the same position as that of the stress cushioning layer was formed.

Next, on the Ni surface of the exposed part of the wiring layer 4, an Au film with a thickness of 0.1 $\mu$m was formed by substitution plating. On the Au plated wiring exposed part, flux (Delta flux 533, by Senju Kinzoku Co., Ltd.) was coated using a metal mask, and Sn—Ag—Cu series solderballs with a diameter of 0.35 mm were put on it and heated at 260° C. for 10 seconds using an infrared reflow furnace, whereby external electrodes 6 were formed. Finally, a scribe line was cut by a dicing saw with a thickness of 0.2 mm, and individual semiconductor chips were separated, whereby a semiconductor apparatus of the present invention was prepared.

As a result of inspection of the appearance of the semiconductor apparatus prepared as mentioned above, package failures, such as a peeling-off of the semiconductor apparatus during dicing, were not generated.

A temperature cycle test (at −55° C. for 10 minutes and at 125° C. for 10 minutes) was executed 1000 times using 10 semiconductor apparatuses mentioned above and the sample appearance is inspected. Furthermore, each of the semiconductor apparatuses was mounted on a mounting substrate, the same temperature cycle test was executed 1000 times, and then an electrical continuity test was executed.

In Comparison example 1, wherein that the chip and stress cushioning layer are positioned on the same surface, peeling-off was generated significantly after the individual temperature cycle; and, on the other hand, in this embodiment, wherein the end of the stress cushioning layer is formed on the inside of the chip end surface, the interface between a semiconductor chip 7 and the stress cushioning layer 3 were not peeled off. In the semiconductor apparatuses of Comparison example 1, the appearance inspection immediately after dicing indicated that interface peeling-off at the end of each semiconductor apparatus was generated in two of the 10 tested semiconductor apparatuses. The characteristic evaluation results of Embodiments 1 to 12 are shown in Table 1. The characteristic evaluation results of Comparison examples 1 and 2 are shown in Table 4.

TABLE 1

| | | Embodiment 1 | Embodiment 2 | Embodiment 3 | Embodiment 4 | Embodiment 5 | Embodiment 6 | Embodiment 7 | Embodiment 8 | Embodiment 9 | Embodiment 10 | Embodiment 11 | Embodiment 12 |
|---|---|---|---|---|---|---|---|---|---|---|---|---|---|
| Distance from chip end face (μm) | Stress cushioning layer | 100 | 100 | 100 | 100 | 100 | 100 | 100 | 100 | 100 | 100 | 100 | 100 |
| | External protection film | 100 | 100 | 100 | 100 | 150 | 150 | 150 | 150 | 50 | 50 | 50 | 50 |
| | Chip protection film | — | — | — | — | — | — | — | — | — | — | — | — |
| Coefficient of elasticity E of stress cushioning layer (MPa) | | 3000 | 1000 | 3000 | 400 | 3000 | 1000 | 3000 | 400 | 3000 | 1000 | 3000 | 400 |
| Thickness of stress cushioning layer (μm) | | 100 | 20 | 20 | 100 | 100 | 20 | 20 | 100 | 100 | 20 | 20 | 100 |
| Package failure rate immediately after dicing (failure count/evaluation count) | | 0/10 | — | — | — | 0/10 | — | — | — | 0/10 | — | — | — |
| Interface peeling-off failure after individual TC (failure count/evaluation count) | Chip - stress cushioning layer | 0/10 | 0/10 | 0/10 | 0/10 | 0/10 | 0/10 | 0/10 | 0/10 | 0/10 | 0/10 | 0/10 | 0/10 |
| | Chip - chip protection film | — | — | — | — | — | — | — | — | — | — | — | — |
| | Stress cushioning layer - chip protection film | — | — | — | — | — | — | — | — | — | — | — | — |
| | Stress cushioning layer - external protection film | 2/10 | 2/10 | 2/10 | 2/10 | 0/10 | 0/10 | 0/10 | 0/10 | 0/10 | 0/10 | 0/10 | 0/10 |
| | External protection film - chip protection film | — | — | — | — | — | — | — | — | — | — | — | — |
| | Chip - external protection film | — | — | — | — | — | — | — | — | 0/10 | 0/10 | 0/10 | 0/10 |
| Disconnection failure after mounting TC (failure count/evaluation count) | | 0/10 | 6/10 | 10/10 | 0/10 | 0/10 | 6/10 | 10/10 | 0/10 | 0/10 | 6/10 | 10/10 | 0/10 |
| Wiring layer pattern failure on stress cushioning layer (failure count/evaluation count) | | 8/40 | 0/40 | 10/40 | 0/40 | 8/40 | 0/40 | 10/40 | 0/40 | 8/40 | 0/40 | 10/40 | 0/40 |

[Embodiment 2]

In the same process as that of Embodiment 1, using an uncured dry film with a thickness of 20 μm, including epoxy resin, orthocresol novolac type curing agent, acrylic rubber, and silica filler, which has a coefficient of elasticity of 1000 MPa at room temperature after curing, the same evaluation as that of Embodiment 1 was performed. In this embodiment, the interface between the semiconductor chip 7 and the stress cushioning layer 3 did not peel off. On the other hand, in Comparison example 1, the interface peeled off significantly after the individual temperature cycle.

[Embodiment 3]

In the same process as that of Embodiment 1, using an uncured dry film with a thickness of 20 μm including epoxy resin, orthocresol novolac type curing agent, acrylic rubber, and silica filler, which has a coefficient of elasticity of 3000 MPa at room temperature after curing, the same evaluation as that of Embodiment 1 was performed.

In this embodiment, the interface between the semiconductor chip 7 and the stress cushioning layer 3 did not peel off. On the other hand, in Comparison example 1, the interface peeled off significantly after the individual temperature cycle.

[Embodiment 4]

In the same process as that of Embodiment 1, using an uncured dry film with a thickness of 100 μm, composed of epoxy resin, orthocresol novolac type curing agent, acrylic rubber, and silica filler, which has a coefficient of elasticity of 400 MPa at room temperature after curing, the same evaluation as that of Embodiment 1 was performed.

In this embodiment, the interface between the semiconductor chip 7 and the stress cushioning layer 3 did not peel off. Since the coefficient of elasticity E (MPa) at room temperature and the thickness t (μm) satisfied the relationship between Formulas (1) and (2) mentioned above, wiring pattern failures caused by a warp of a semiconductor wafer were not generated. The cushioning effect of the stress cushioning layer is high and disconnection failures at the time of temperature cycle after mounting are further reduced. On the other hand, in Comparison example 1, the interface peeled off significantly after the individual temperature cycle.

[Embodiment 5]

Figure 2:
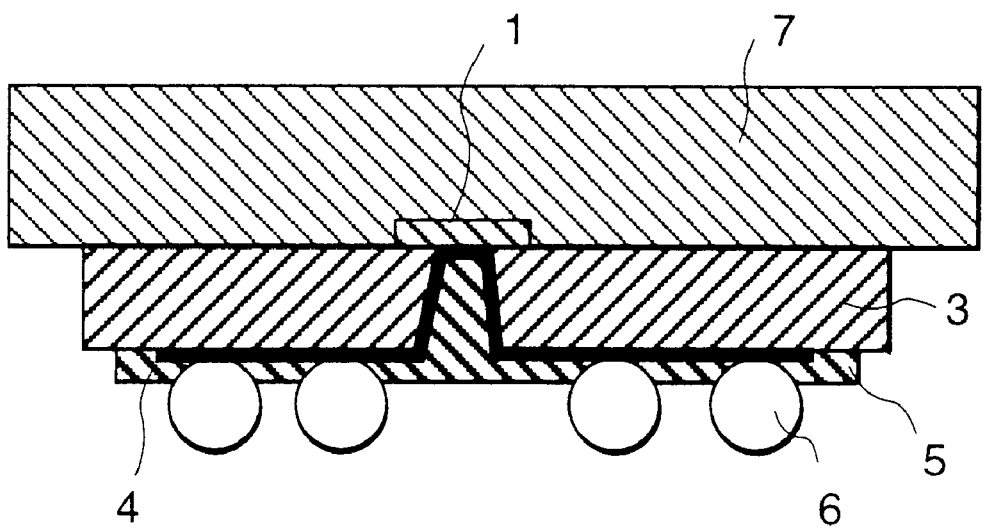
FIG. 2 is a cross sectional schematic view of a semiconductor apparatus representing another example of the present invention.

FIG. 2 is a cross sectional view of another semiconductor apparatus of the present invention. This semiconductor apparatus was prepared by the same method as that of Embodiment 1 and the characteristics were evaluated by the same method.

In this embodiment, the interface between the semiconductor chip 7 and the stress cushioning layer 3 did not peel off. When the end of the external protection film is formed so as to be positioned 50 μm inside the end of the stress cushioning layer, the peeling-off failure of the interface between the stress cushioning layer and the external protection film is improved. By the semiconductor apparatus manufacturing method of the present invention, no package failure is generated immediately after dicing.

[Embodiment 6]

In the same process as that of Embodiment 5, using an uncured dry film with a thickness of 20 μm, composed of epoxy resin, orthocresol novolac type curing agent, acrylic rubber, and silica filler, which has a coefficient of elasticity of 1000 MPa at room temperature after curing, the same semiconductor apparatus as that of Embodiment 5 was prepared and the same evaluation was performed.

In this embodiment, the interface between the semiconductor chip 7 and the stress cushioning layer 3 did not peel off. When the end of the external protection film is formed so as to be positioned 50 µm inside the end of the stress cushioning layer, the peeling-off failure of the interface between the stress cushioning layer and the external protection film is improved.

[Embodiment 7]

In the same process as that of Embodiment 5, using an uncured dry film with a thickness of 100 µm, composed of epoxy resin, orthocresol novolac type curing agent, acrylic rubber, and silica filler, which has a coefficient of elasticity of 3000 MPa at room temperature after curing, the same semiconductor apparatus as that of Embodiment 5 was prepared and the same evaluation was performed.

In this embodiment, the interface between the semiconductor chip 7 and the stress cushioning layer 3 did not peel off. When the end of the external protection film is formed so as to be positioned 50 µm inside the end of the stress cushioning layer, the peeling-off failure of the interface between the stress cushioning layer and the external protection film is improved.

[Embodiment 8]

In the same process as that of Embodiment 5, using an uncured dry film with a thickness of 100 µm, composed of epoxy resin, orthocresol novolac type curing agent, acrylic rubber, and silica filler, which has a coefficient of elasticity of 400 MPa at room temperature after curing, the same semiconductor apparatus as that of Embodiment 5 was prepared and the same evaluation was performed.

In this embodiment, the interface between the semiconductor chip 7 and the stress cushioning layer 3 did not peel off. When the end of the external protection film 5 is formed so as to be positioned 50 µm inside the end of the stress cushioning layer 3, the peeling-off failure of the interface between the stress cushioning layer and the external protection film is improved. Since the coefficient of elasticity E (MPa) at room temperature and thickness t (µm) satisfied the relationship between Formulas (1) and (2) mentioned above, wiring pattern failures caused by a warp of a semiconductor wafer were not generated. The cushioning effect of the stress cushioning layer is high, and so disconnection failures at the time of temperature cycle after mounting are further reduced.

[Embodiment 9]

Figure 3:
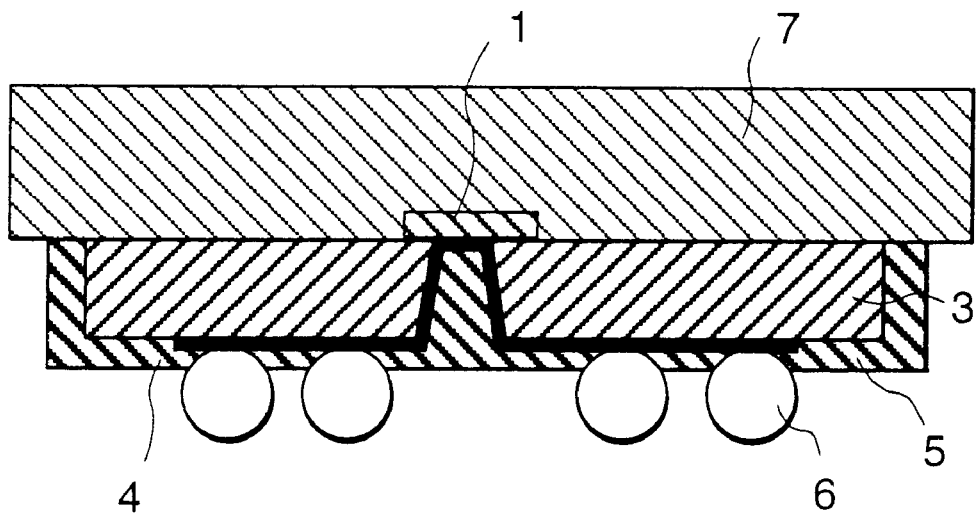
FIG. 3 is a cross sectional schematic view of a semiconductor apparatus representing still another example of the present invention.

FIG. 3 is a cross sectional view of a semiconductor apparatus which represents another example of the present invention. This semiconductor apparatus was prepared by the same method as that of Embodiment 1 and the characteristics were measured.

As a result of inspection of the appearance of the aforementioned semiconductor apparatus immediately after dicing, it was found that package failures, such as peeling-off of the semiconductor apparatus during dicing, were not generated.

Furthermore, a temperature cycle test (at −55° C. for 10 minutes and at 125° C. for 10 minutes) was executed 1000 times using 10 semiconductor apparatuses mentioned above, the samples were cut off, and the sections thereof were inspected. Furthermore, each of the semiconductor apparatuses was mounted on a mounting substrate, a temperature cycle test (at −55° C. for 10 minutes and at 125° C. for 10 minutes) was executed 1000 times, and then an electrical continuity test was executed.

In this embodiment, the end of the stress cushioning layer 3 and the external protection film 5 were formed on the inside of the chip end face, so that no peeling-off was generated between the semiconductor chip and the external protection film. In Comparison example 1 mentioned above, significantly peeling-off was generated after the individual temperature cycle. On the other hand, when an external protection film is formed so as to cover the end of the stress cushioning layer 3, the interface between the semiconductor chip 2 and the stress cushioning layer 3 and the interface between the stress cushioning layer 3 and the external protection film 5 are not peeled off. By the semiconductor apparatus manufacturing method of the present invention, no package failure is generated immediately after dicing.

[Embodiment 10]

In the same process as that of Embodiment 9, using an uncured dry film with a thickness of 20 µm, including epoxy resin, orthocresol novolac type curing agent, acrylic rubber, and silica filler, which has a coefficient of elasticity of 1000 MPa at room temperature after curing, the same semiconductor apparatus as that of Embodiment 9 was prepared and the same evaluation was performed.

In this embodiment, the end of the stress cushioning layer 3 and the external protection film 5 are formed on the inside of the chip end face, so that no peeling-off was generated between the semiconductor chip and the external protection film. Since the external protection film is formed so as to cover the end of the stress cushioning layer 3, the interface between the semiconductor chip 2 and the stress cushioning layer 3 and the interface between the stress cushioning layer 3 and the external protection film 5 were not peeled off.

[Embodiment 11]

In the same process as that of Embodiment 9, using an uncured dry film with a thickness of 100 µm including epoxy resin, orthocresol novolac type curing agent, acrylic rubber, and silica filler, which has a coefficient of elasticity of 3000 MPa at room temperature after curing, the same semiconductor apparatus as that of Embodiment 9 was prepared and the same evaluation was performed.

In this embodiment, the end of the stress cushioning layer 3 sand the external protection film 5 were formed on the inside of the chip end face, so that no peeling-off was generated between the semiconductor chip and the external protection film. since the external protection film is formed so as to cover the end of the stress cushioning layer 3, the interface between the semiconductor chip 2 and the stress cushioning layer 3 and the interface between the stress cushioning layer 3 and the external protection film 5 were not peeled off.

[Embodiment 12]

In the same process as that of Embodiment 9, using an uncured dry film with a thickness of 100 µm including epoxy resin, orthocresol novolac type curing agent, acrylic rubber, and silica filler, which has a coefficient of elasticity of 400 MPa at room temperature after curing, the same semiconductor apparatus as that of Embodiment 9 was prepared and the same evaluation was performed.

In this embodiment of the present invention, the end of the stress cushioning layer 3 and the external protection film 5 are formed on the inside of the chip end face, so that no peeling-off was generated between the semiconductor chip and the external protection film. Since the external protection film is formed so as to cover the end of the stress cushioning layer 3, the interface between the semiconductor chip 2 and the stress cushioning layer 3 and the interface between the stress cushioning layer 3 and the external protection film 5 were not peeled off.

Furthermore, since the coefficient of elasticity E (MPa) at room temperature and thickness t ($\mu$m) satisfy the relationship between Formulas (1) and (2) mentioned above, wiring pattern failures caused by a warp of a semiconductor wafer were not generated. The cushioning effect of the stress cushioning layer is high, and so disconnection failures at the time of the temperature cycle after mounting were further reduced.

[Embodiment 13]

Figure 4:
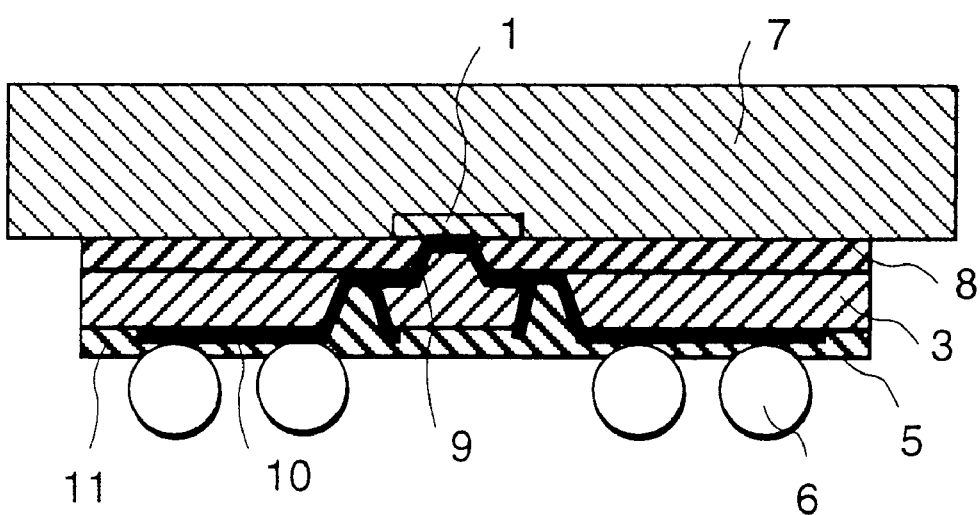
FIG. 4 is a cross sectional schematic view of a semiconductor apparatus representing a further example of the present invention.

FIG. 4 is a cross sectional view of another semiconductor apparatus of the present invention. This semiconductor apparatus was prepared by the following method and the characteristics were measured.

A negative photosensitive polyimide resin (PL3708, by Hitachi Kasei Kogyo Co., Ltd.) was spin-coated on the surface of a silicone semiconductor wafer, having a plurality of semiconductor elements and an Al electrode 1 formed on the surface thereof, and the coating was dried on a hot plate at 75° C. for 105 seconds and at 90° C. for 105 seconds. Thereafter, it was exposed using a predetermined mask, heated again on the hot plate at 125° C. for 60 seconds, and then developed in a developer (PL Developer 2N, by Hitachi Kasei Kogyo Co., Ltd.).

Next, it was heated and cured in nitrogen at 350° C. for 60 seconds, and a chip protection film 8, wherein the element electrode and the semiconductor chip surface are exposed linearly up to 100 $\mu$m inside the chip end face after dicing was formed.

Next, the Al oxide film on the surface of the element electrode 1 was removed by sputter etching using Ar, and then Cr of 500 Å in thickness and additionally Cu of 0.5 $\mu$m in thickness were sputter-deposited on the chip protection film 8 and over all of the exposure part surface so as to form a film. On the deposited film, a negative photosensitive resist (OFPR-N-3000, by Tokyo Oka Co., Ltd.) was spin-coated and a resist wiring pattern with a thickness of 15 $\mu$m was formed by prebaking, exposure, and development.

A Cu film with a thickness of 10 $\mu$m is formed inside the aforementioned wiring pattern by electroplating and a first wiring layer 9 was formed.

Next, an uncured dry film with a thickness of 100 $\mu$m, including epoxy resin, orthocresol novolac type curing agent, acrylic resin, polyamide-imide resin, and silica filler, which has a coefficient of elasticity of 3000 MPa at room temperature after curing, was adhered at 180° C. using a roll laminator and then heated and cured at 250° C. for one hour, whereby a stress cushioning layer 3 was formed. In the stress cushioning layer, using a carbonic acid gas laser, an opening with a hole diameter of 50 $\mu$m and a 400-$\mu$m slit for exposing a 200-$\mu$m scribe line were formed.

Next, in order to remove residues of laser processing of a land 10 of the first wiring layer, a desmearing treatment was executed using a desmearing treatment liquid (MLB497, by Meltex Co., Ltd. ) of the permanganate series. The Cu oxide film was removed by sputter-etching the stress cushioning layer 3, with the opening and the linear slit formed therein, and the whole opening, by Ar, and Cr of 500 Å in thickness and then Cu of 0.5 $\mu$m in thickness were deposited. On the deposited film, a negative photosensitive resist (OFPR-N-3000, by Tokyo Oka Co., Ltd.) was spin-coated, and a resist wiring pattern with a thickness of 15 $\mu$m was formed by prebaking, exposure, and development.

A Cu film with a thickness of 10 $\mu$m was formed inside the wiring pattern obtained above by electroplating, and an Ni film with a thickness of 2 $\mu$m was formed on it by electroplating. Next, the resist was peeled off using a release liquid (N-303C), and then the Cu deposited film was etched by an ammonium persulfate/sulfuric acid solution, and additionally Cr was etched by a potassium permanganate solution, whereby a second wiring layer 11 was formed. At the stage of completion of this process, the failure rate of the second wiring pattern was evaluated.

Next, on a wafer having the second wiring layer, photosensitive solder resist varnish (SR9000, by Hitachi Kasei Kogyo Co., Ltd.) was coated by a screen print process, dried at 80° C. for 20 minutes, exposed and developed using a predetermined pattern, and cured at 150° C. for one hour; and, on the wiring layer, an external protection film 5 having an opening for connecting an external electrode and having an end at the same position as that of the stress cushioning layer was formed.

Next, on the Ni surface of the exposed part of the wiring layer 3, an Au film with a thickness of 0.1 $\mu$m was formed by substitution plating. On the Au plated wiring exposed part, flux (Delta flux 533, by Senju Kinzoku Co., Ltd.) was coated using a metal mask, and Sn—Ag—Cu series solder balls with a diameter of 0.35 mm were put on it and heated at 260° C. for 10 seconds using an infrared reflow furnace, whereby external electrodes 6 were formed. Finally, a scribe line was cut by a dicing saw with a thickness of 0.2 mm, so that individual semiconductor chips were separated, whereby a semiconductor apparatus of the present invention was prepared.

As a result of inspection of the appearance of the aforementioned semiconductor apparatus immediately after dicing, it was found that package failures, such as peeling-off of the semiconductor apparatus during dicing, were not generated.

A temperature cycle test (at −55° C. for 10 minutes and at 125° C. for 10 minutes) was executed 1000 times using 10 semiconductor apparatuses mentioned above and the sample appearance was inspected. Furthermore, each of the semiconductor apparatuses is mounted on a mounting substrate, and the same temperature cycle test is executed 1000 times, and the electrical continuity test after testing is executed.

In the embodiment of the present invention, in which the end of the chip protection film 8 is formed on the inside of the chip end surface, the interface between the semiconductor chip 7 and the chip protection film 8 did not peel off. On the other hand, in Comparison example 2, in which the semiconductor chip 7 and the chip protection film 8 are formed on the same surface, significant peeling-off was generated. In the semiconductor apparatuses prepared by the manufacturing method of Comparison example 2, the appearance inspection immediately after dicing indicated that interface peeling-off at the end of each semiconductor apparatus was generated in two of the 10 tested semiconductor apparatuses. Using the semiconductor apparatus manufacturing method of the present invention, no package failure was generated immediately after dicing. The characteristic evaluation results of Embodiments 13 to 24 are shown in Table 2.

TABLE 2

|  |  | Embodiment 13 | Embodiment 14 | Embodiment 15 | Embodiment 16 | Embodiment 17 | Embodiment 18 | Embodiment 19 | Embodiment 20 | Embodiment 21 | Embodiment 22 | Embodiment 23 | Embodiment 24 |
|---|---|---|---|---|---|---|---|---|---|---|---|---|---|
| Distance from chip end face ($\mu$m) | Stress cushioning layer | 100 | 100 | 100 | 100 | 100 | 100 | 100 | 100 | 100 | 100 | 100 | 100 |
|  | External protection film | 100 | 100 | 100 | 100 | 150 | 150 | 150 | 150 | 150 | 150 | 150 | 150 |
|  | Chip protection film | 100 | 100 | 100 | 100 | 100 | 100 | 100 | 100 | 50 | 50 | 50 | 50 |
| Coefficient of elasticity E of stress cushioning layer (MPa) |  | 3000 | 1000 | 3000 | 400 | 3000 | 1000 | 3000 | 400 | 3000 | 1000 | 3000 | 400 |
| Thickness of stress cushioning layer ($\mu$m) |  | 100 | 20 | 20 | 100 | 100 | 20 | 20 | 100 | 100 | 20 | 20 | 100 |
| Package failure rate immediately after dicing (failure count/evaluation count) |  | 0/10 | — | — | — | 0/10 | — | — | — | 0/10 | — | — | — |
| Interface peeling-off failure after individual TC (failure count/ evaluation count) | Chip - stress cushioning layer | — | — | — | — | — | — | — | — | — | — | — | — |
|  | Chip - chip protection film | 0/10 | 0/10 | 0/10 | 0/10 | 0/10 | 0/10 | 0/10 | 0/10 | 0/10 | 0/10 | 0/10 | 0/10 |
|  | Stress cushioning layer - chip protection film | 3/10 | 3/10 | 3/10 | 2/10 | 3/10 | 3/10 | 3/10 | 3/10 | 0/10 | 0/10 | 0/10 | 0/10 |
|  | Stress cushioning layer - external protection film | 3/10 | 3/10 | 3/10 | 3/10 | 0/10 | 0/10 | 0/10 | 0/10 | 0/10 | 0/10 | 0/10 | 0/10 |
|  | External protection film - chip protection film | — | — | — | — | — | — | — | — | — | — | — | — |
|  | Chip - external protection film | — | — | — | — | — | — | — | — | — | — | — | — |
| Disconnection failure after mounting TC (failure count/evaluation count) |  | 0/10 | 6/10 | 10/10 | 0/10 | 0/10 | 5/10 | 10/10 | 0/10 | 0/10 | 6/10 | 10/10 | 0/10 |
| Wiring layer pattern failure on stress cushioning layer (failure count/evaluation count) |  | 8/40 | 0/40 | 9/40 | 0/40 | 7/40 | 0/40 | 9/40 | 0/40 | 8/40 | 0/40 | 10/40 | 0/40 |

[Embodiment 14]

A semiconductor apparatus was prepared by the same method as that of Embodiment 13. In this case, a stress cushioning layer was formed by adhering an uncured dry film with a thickness of 20 $\mu$m, composed of epoxy resin, orthocresol novolac type curing agent, acrylic resin, polyamide-imide resin, and silica filler, which has a coefficient of elasticity of 1000 MPa at room temperature after curing at 180° C. using a roll laminator, and then heating and curing it at 250° C. for one hour. The same characteristic evaluation as that of Embodiment 13 was performed.

In this embodiment, in which the end of the chip protection film 8 is formed on the inside of the chip end face, the interface between the semiconductor chip 7 and the chip protection film 8 did not peel off.

[Embodiment 15]

A semiconductor apparatus was prepared by the same method as that of Embodiment 13. In this case, a stress cushioning layer was formed by adhering an uncured dry film with a thickness of 20 $\mu$m, composed of epoxy resin, orthocresol novolac type curing agent, acrylic resin, polyamide-imide resin, and silica filler, which has a coefficient of elasticity of 3000 MPa at room temperature after curing at 180° C. using a roll laminator, and then heating and curing it at 250° C. for one hour. The same characteristic evaluation as that of Embodiment 13 was performed.

Although in Comparison example 2 mentioned above, significant peeling-off was generated, in this embodiment in which the end of the chip protection film 8 is formed on the inside of the chip end face, the interface between the semiconductor chip 7 and the chip protection film 8 did not off.

[Embodiment 16]

A semiconductor apparatus was prepared by the same method as that of Embodiment 13. In this case, a stress cushioning layer was formed by adhering an uncured dry film with a thickness of 100 $\mu$m, including epoxy resin, orthocresol novolac type curing agent, acrylic resin, polyamide-imide resin, and silica filler, which has a coefficient of elasticity of 400 MPa at room temperature after curing at 180° C. using a roll laminator, and then heating and curing it at 250° C. for one hour. The same characteristic evaluation as that of Embodiment 13 was performed.

In this embodiment of the present invention, in which the end of the chip protection film 8 is formed on the inside of the chip end face, the interface between the semiconductor chip 7 and the chip protection film 8 did not peel off. Furthermore, since the coefficient of elasticity E (MPa) at room temperature and thickness t ($\mu$m) satisfy the relationship between Formulas (1) and (2) mentioned above, wiring pattern failures caused by a warp of the semiconductor wafer were not generated. The cushioning effect of the stress cushioning layer is high, and so disconnection failures at the time of the temperature cycle after mounting were further reduced.

[Embodiment 17]

Figure 5:
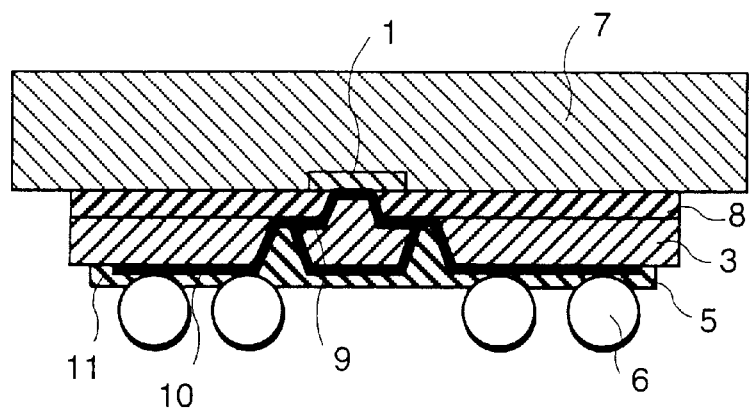
FIG. 5 is a cross sectional schematic view of a semiconductor apparatus representing a still further example of the present invention.

FIG. 5 is a cross sectional view of another semiconductor apparatus of the present invention. This semiconductor apparatus was prepared by the following method.

A negative photosensitive polyimide resin (PL3708, by Hitachi Kasei Kogyo Co., Ltd.) was spin-coated on the surface of a silicone semiconductor wafer having a plurality of semiconductor elements and an Al electrode 1 formed on the surface thereof. Then, the coating was dried on a hot plate at 75° C. for 105 seconds and at 90° C. for 105 seconds, exposed using a predetermined mask, heated again on the hot plate at 125° C. for 60 seconds, and then developed in a developer (PL Developer 2N, by Hitachi Kasei Kogyo Co., Ltd.). Next, it was heated and cured in nitrogen at 350° C. for 60 seconds, and a chip protection film 8 in which the semiconductor chip surface is exposed linearly up to 100 $\mu$m inside from the element electrode 1 and the chip end face after dicing, was formed. Next, the Al oxide film on the surface of the element electrode 1 was removed by sputter etching using Ar, and then Cr of 500 Å in thickness and additionally Cu of 0.5 $\mu$m in thickness were sputter-deposited on the chip protection film 8 and over all of the exposure part surface so as to form a film. On the deposited film, a negative photosensitive resist (OFPR-N-3000, by Tokyo Oka Co., Ltd. ) was spin-coated and a resist wiring pattern with a thickness of 15 $\mu$m is formed by prebaking, exposure, and development. A Cu film with a thickness of 10 $\mu$m was formed inside the aforementioned wiring pattern by electroplating, whereby a first wiring layer 9 was formed.

Next, an uncured dry film with a thickness of 100 $\mu$m, composed of epoxy resin, orthocresol novolac type curing agent, acrylic resin, polyamide-imide resin, and silica filler, which has a coefficient of elasticity of 3000 MPa at room temperature after curing, was adhered at 180° C. using a roll laminator and then heated and cured at 250° C. for one hour, whereby a stress cushioning layer 3 was formed. In the stress cushioning layer, using a carbonic acid gas laser, an opening with a hole diameter of 50 $\mu$m and a 400-$\mu$m slit for exposing a 200-$\mu$m scribe line were formed.

Next, in order to remove residues of the laser processing of a land 10 of the first wiring layer, a desmearing treatment was executed using a desmearing treatment liquid (MLB497, by Meltex Co., Ltd.) of the permanganate series. The stress cushioning layer 3, with the opening and the linear slit formed therein, and the whole opening are sputter-etched by Ar so as to remove the Cu oxide film, and then Cr of 500 Å in thickness and then Cu of 0.5 $\mu$m in thickness were sputter-deposited. On the deposited film, a negative photosensitive resist (OFPR-N-3000, by Tokyo Oka Co., Ltd.) was spin-coated and a resist wiring pattern with a thickness of 15 $\mu$m was formed by prebaking, exposure, and development.

Next, a Cu film with a thickness of 10 $\mu$m was formed inside the wiring pattern obtained above by electroplating and an Ni film with a thickness of 2 $\mu$m was formed on it by electroplating. Next, the resist was peeled off using a release liquid (N-303C), and then the Cu deposited film was etched by an ammonium persulfate/sulfuric acid solution, and additionally Cr was etched by a potassium permanganate solution, whereby a second wiring layer 11 was formed.

At the stage of completion of this process, the failure rate of the second wiring pattern was evaluated.

Next, photosensitive solder resist varnish (SR9000, by Hitachi Kasei) was coated by a screen print previous, dried at 80° C. for 20 minutes, exposed and developed using a predetermined pattern, and cured at 150° C. for one hour. Thus, on the wiring layer, an external protection film 5 having an opening for connecting an external electrode and having an end 50 $\mu$m inside the end face of the stress cushioning layer was formed. Next, on the Ni surface of the exposed part of the wiring layer 3, an Au film with a thickness of 0.1 $\mu$m was formed by substitution plating. On the Au plated wiring exposed part, flux (Delta flux 533, by Senju Kinzoku) was coated using a metal mask, and Sn—Ag—Cu series solder balls with a diameter of 0.35 mm were put on it and heated at 260° C. for 10 seconds using an infrared reflow furnace, whereby external electrodes 6 were formed. Finally, a scribe line was cut by a dicing saw with a thickness of 0.2 mm, so that individual semiconductor chips were separated, whereby a semiconductor apparatus of the present invention was prepared.

As a result of inspection of the appearance of the aforementioned semiconductor apparatus immediately after dicing, it was found that package failures, such as peeling-off of the semiconductor apparatus during dicing, were not generated.

[Embodiment 18]

A semiconductor apparatus was prepared by the same method as that of Embodiment 17. In this case, a stress cushioning layer was formed by adhering an uncured dry film with a thickness of 20 $\mu$m composed of epoxy resin, orthocresol novolac type curing agent, acrylic resin, polyamide-imide resin, and silica filler, which has a coefficient of elasticity of 1000 MPa at room temperature after curing at 180° C. using a roll laminator, and then heating and curing it at 250° C. for one hour. The same characteristic evaluation as that of Embodiment 17 was performed.

In this embodiment of the present invention, wherein the end of the chip protection film 8 is formed on the inside of the chip end face, the interface between the semiconductor chip 7 and the chip protection film 8 did not peel off. Since the end of the external protection film 5 is formed on the inside of the end of the stress cushioning layer 3, no peeling-off failure was generated in the interface between the stress cushioning layer 3 and the external protection film 5.

[Embodiment 19]

A semiconductor apparatus was prepared by the same method as that of Embodiment 17. In this case, a stress cushioning layer was formed by adhering an uncured dry film with a thickness of 20 $\mu$m, composed of epoxy resin, orthocresol novolac type curing agent, acrylic resin, polyamide-imide resin, and silica filler, which has a coefficient of elasticity of 3000 MPa at room temperature after curing at 180° C. using a roll laminator, and then heating and curing it at 250° C. for one hour. The same characteristic evaluation as that of Embodiment 17 was performed.

In this embodiment of the present invention, in which the end of the chip protection film 8 is formed on the inside of the chip end face, the interface between the semiconductor chip 7 and the chip protection film 8 did not peel off. Since the end of the external protection film 5 is formed on the inside of the end of the stress cushioning layer 3, no peeling-off failure was generated in the interface-between the stress cushioning layer 3 and the external protection film 5.

[Embodiment 20]

A semiconductor apparatus was prepared by the same method as that of Embodiment 17. In this case, a stress cushioning layer was formed by adhering an uncured dry film with a thickness of 100 $\mu$m, composed of epoxy resin, orthocresol novolac type curing agent, acrylic resin, polyamide-imide resin, and silica filler, which has a coefficient of elasticity of 400 MPa at room temperature after curing at 180° C. using a roll laminator, and then heating and curing it at 250° C. for one hour. The same characteristic evaluation as that of Embodiment 17 was performed.

In this embodiment of the present invention, in which the end of the chip protection film 8 is formed on the inside of the chip end face, the interface between the semiconductor chip 7 and the chip protection film 8 did not peel off. Since the end of the external protection film 5 is formed on the inside of the end of the stress cushioning layer 3, no peeling-off failure was generated in the interface between the stress cushioning layer 3 and the external protection film 5. Furthermore, since the coefficient of elasticity E (MPa) at room temperature and thickness t ($\mu$m) satisfy the relationship between Formulas (1) and (2) mentioned above, wiring pattern failures caused by the warp of a semiconductor wafer were not generated. The cushioning effect of the stress cushioning layer is high, and so disconnection failures at the time of temperature cycle after mounting were further reduced.

[Embodiment 21]

Figure 6:
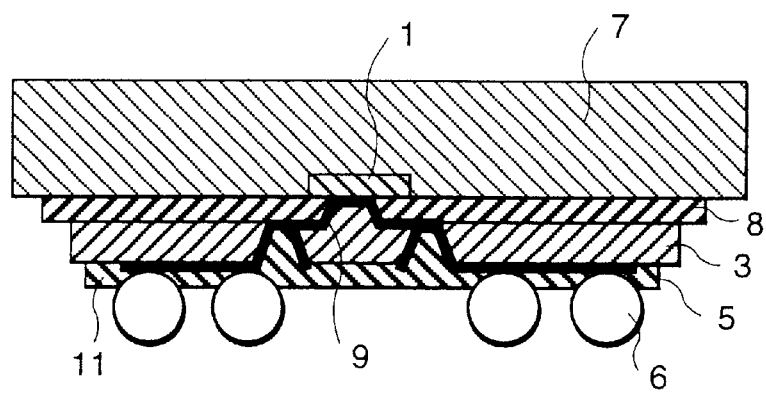
FIG. 6 is a cross sectional schematic view of a semiconductor apparatus representing yet a further example of the present invention.

FIG. 6 is a cross sectional view of another semiconductor apparatus of the present invention. This semiconductor apparatus was prepared by the following method.

Firstly, the process of forming the first wiring layer 9 was the same as that of Embodiment 13.

Next, an uncured photosensitive dry film with a thickness of 100 $\mu$m, composed of epoxy resin, orthocresol novolac type curing agent, nitrite butadiene rubber, photo-oxidation agent, sensitizer, and silica filler, which has a coefficient of elasticity of 3000 MPa at room temperature after curing, was adhered at 90° C. using a roll laminator. Thereafter, in order to expose the land 10 of the first wiring layer and the scribe line which is a cut line produced at dicing time, it was exposed using a predetermined mask, developed using an alkaline developer of the semiwater system, and then heated and cured at 180° C. for one hour. Then, the stress cushioning layer 3 was formed so that an opening with a hole diameter of 50 $\mu$m was formed in the land 10 of the first wiring layer and the end of the stress cushioning layer 3 was formed 100 $\mu$m inside the chip end face after dicing and 50 $\mu$m inside the chip protection film 8.

Next, in order to remove residues in the bier of the land 10 of the first wiring layer, a desmearing treatment was executed using a desmearing treatment liquid (MLB497, by Meltex Co., Ltd.) of the permanganate series. Next, the stress cushioning layer 3 with the opening and the linear slit formed therein and the whole opening were sputter-etched by Ar so as to remove the Cu oxide film, and then Cr of 500 Å in thickness and additionally Cu of 0.5 $\mu$m in thickness were sputter-deposited.

On the deposited film, a negative photosensitive resist (OFPR-N-3000, by Tokyo Oka Co., Ltd. ) was spin-coated and a resist wiring pattern with a thickness of 15 $\mu$m was formed by prebaking, exposure, and development. A Cu film with a thickness of 10 $\mu$m was formed inside the wiring pattern obtained above by electroplating, and an Ni film with a thickness of 2 $\mu$m was formed on it by electroplating. The resist was peeled off using a release liquid (N-303C), and then the Cu deposited film was etched by an ammonium persulfate/sulfuric acid solution, and additionally Cr was etched by a potassium permanganate solution, whereby a second wiring layer 11 was formed.

At the stage of completion of this process, the failure rate of the second wiring pattern was evaluated.

Next, on a wafer having the second wiring layer, photosensitive solder resist varnish (SR9000, by Hitachi Kasei Kogyo Co., Ltd.) was coated by a screen print process, dried at 80° C. for 20 minutes, exposed and developed using a predetermined pattern, and cured at 150° C. for one hour and on the wiring layer, whereby an external protection film 5 having an opening for connecting an external electrode and having an end 50 $\mu$m inside the end of the stress cushioning layer was formed.

Next, on the Ni surface of the exposed part of the wiring layer 3, an Au film with a thickness of 0.1 $\mu$m was formed by substitution plating. On the Au plated wiring exposed part, flux (Delta flux 533, by Senju Kinzoku Co., Ltd.) was coated using a metal mask, and Sn—Ag—Cu series solder balls with a diameter of 0.35 mm were put on it and heated at 260° C. for 10 seconds using an infrared reflow furnace, whereby external electrodes 6 were formed. Finally, a scribe line was cut by a dicing saw with a thickness of 0.2 mm, so that individual semiconductor chips were separated, whereby a semiconductor apparatus of the present invention was prepared.

As a result of inspection of the appearance of the aforementioned semiconductor apparatus immediately after dicing, it was found that package failures, such as peeling-off of the semiconductor apparatus during dicing, were not generated.

A temperature cycle test (at −55° C. for 10 minutes and at 125° C. for 10 minutes) was executed 1000 times using 10 semiconductor apparatuses mentioned above and the sample appearance was inspected. Furthermore, each of the semiconductor apparatuses was mounted on a mounting substrate, and the same temperature cycle test was executed 1000 times, and then an electrical continuity test was executed.

In this embodiment of the present invention, in which the end of the chip protection film 8 is formed on the inside of the chip end face, the interface between the semiconductor chip 7 and the chip protection film 8 did not peel off. Since the end of the external protection film 5 is formed on the inside of the end of the stress cushioning layer 3, no peeling-off failure was generated in the interface between the stress cushioning layer 3 and the external protection film 5. Furthermore, since the stress cushioning layer 3 is formed on the inside of the chip protection film 8 no peeling-off failure was generated in the interface between the stress cushioning layer 3 and the chip protection film 8.

In the semiconductor apparatuses prepared by the manufacturing method of Comparison example 2, the appearance inspection immediately after dicing indicated that interface peeling-off at the end of each semiconductor apparatus was generated in two of the 10 tested semiconductor apparatuses. However, using the semiconductor apparatus manufacturing method of the present invention, no package failure was generated immediately after dicing.

[Embodiment 22]

A semiconductor apparatus was prepared by the same method as that of Embodiment 21. In this case, the stress cushioning layer was formed by using an uncured photosensitive dry film with a thickness of 20 $\mu$m, including epoxy resin, orthocresol novolac type curing agent, nitrite butadiene rubber, photo-oxidation agent, sensitizer, and silica filler as dry film materials, which has a coefficient of elasticity of 1000 MPa at room temperature after curing. The same evaluation as that of embodiment 21 was performed.

In this embodiment, in which the end of the chip protection film 8 is formed on the inside of the chip end face, the interface between the semiconductor chip 7 and the chip protection film 8 did not peel off. Since the end of the external protection film 5 is formed on the inside of the end of the stress cushioning layer 3, no peeling-off failure was generated in the interface between the stress cushioning layer 3 and the external protection film 5. Furthermore, since the stress cushioning layer 3 is formed on the inside of the chip protection film 8, no peeling-off failure was generated in the interface between the stress cushioning layer 3 and the chip protection film 8.

[Embodiment 23]

A semiconductor apparatus was prepared by the same method as that of Embodiment 21. In this case, the stress cushioning layer was formed by using an uncured photosensitive dry film with a thickness of 20 μm, composed of epoxy resin, orthocresol novolac type curing agent, nitrite butadiene rubber, photo-oxidation agent, sensitizer, and silica filler as dry film materials, which has a coefficient of elasticity of 3000 MPa at room temperature after curing. The same evaluation as that of Embodiment 21 was performed.

In this embodiment, in which the end of the chip protection film 8 is formed on the inside of the chip end face, the interface between the semiconductor chip 7 and the chip protect ion film 8 did not peel off. Since the end of the external protection film 5 is formed on the inside of the end of the stress cushioning layer 3, no peeling-off failure was generated in the interface between the stress cushioning layer 3 and the external protection film 5. Furthermore, since the stress cushioning layer 3 is formed on the inside of the chip protection film 8, no peeling-off failure was generated in the interface between the stress cushioning layer 3 and the chip protection film 8.

[Embodiment 24]

A semiconductor apparatus was prepared by the same method as that of Embodiment 21. In this case, the stress cushioning layer was formed by using an uncured photosensitive dry film with a thickness of 20 μm including epoxy resin, orthocresol novolac type curing agent, nitrite butadiene rubber, photo-oxidation agent, sensitizer, and silica filler as dry film materials, which has a coefficient of elasticity of 400 MPa at room temperature after curing. The same evaluation as that of Embodiment 21 was performed.

In this embodiment, no peeling-off failure was generated in the interface between the semiconductor chip 7 and the chip protection film 8 and the interface between the stress cushioning layer 3 and the external protection film 5. Furthermore, since the stress cushioning layer 3 is formed on the inside of the chip protection film 8, no peeling-off failure was generated in the interface between the stress cushioning layer 3 and the chip protection film 8.

Since the coefficient of elasticity E (MPa) at room temperature and thickness t (μm) satisfy the relationship between Formulas (1) and (2) mentioned above, wiring pattern failures caused by a warp of the semiconductor wafer were not generated. The cushioning effect of the stress cushioning layer is high, and so disconnection failures at the time of temperature cycle after mounting were reduced.

[Embodiment 25]

Figure 7:
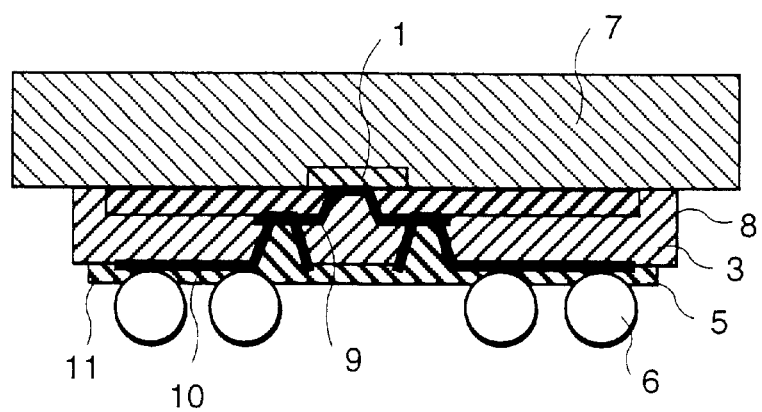
FIG. 7 is a cross sectional schematic view of a semiconductor apparatus representing yet a further example of the present invention.

FIG. 7 is a cross sectional view of another semiconductor apparatus of the present invention. This semiconductor apparatus was prepared by the following method.

Firstly, a wiring substrate was prepared by the same method as that of Embodiment 13. At the stage of completion of this process, the failure rate of the second wiring pattern was evaluated.

Next, on a wafer having the second wiring layer, photosensitive solder resist varnish (SR9000, by Hitachi Kasei Kogyo Co., Ltd.) was coated by a screen print process, dried at 80° C. for 20 minutes, exposed and developed using a predetermined pattern, and cured at 150° C. for one hour. Then, on the wiring layer, an external protection film 5 having an opening for connecting an external electrode and having an end 50 μm inside the end of the stress cushioning layer was formed.

Next, on the Ni surface of the exposed part of the wiring layer 3, an Au film with a thickness of 0.1 μm was formed by substitution plating. On the Au plated wiring exposed part, flux (Delta flux 533, by Senju Kinzoku) was coated using a metal mask, and Sn—Ag—Cu series solder balls with a diameter of 0.35 nm were put on it and heated at 260° C. for 10 seconds using an infrared reflow furnace, and external electrodes 6 were formed. Finally, a scribe line was cut by a dicing saw with a thickness of 0.2 mm, so that individual semiconductor chips were separated, whereby a semiconductor apparatus of the present invention was prepared.

As a result of inspection of the appearance of the aforementioned semiconductor apparatus immediately after dicing, it was found that package failures, such as peeling-off of the semiconductor apparatus during dicing, were not generated.

Furthermore, the same temperature cycle test was executed using 10 semiconductor apparatuses mentioned above, and the samples were cut off, and the sections were inspected. Furthermore, each of the semiconductor apparatuses was mounted on a mounting substrate, and the same temperature cycle test was executed, and then an electrical continuity test was executed.

In this embodiment, in which the end of the chip protection film 8 is formed on the inside of the chip end face, the interface between the semiconductor chip 7 and the chip protection film 8 did not peel off. Since the end of the external protection film 5 is formed on the inside of the end of the stress cushioning layer 3, no peeling-off failure was generated in the interface between the stress cushioning layer 3 and the external protection film 5. Furthermore, since the end of the chip protection film 8 was formed on the inside of the stress cushioning layer 3, no peeling-off failure is generated in the interface between the stress cushioning layer 3 and the chip protection film 8 and the interface between the semiconductor chip 7 and the chip protection film 8. Using the semiconductor apparatus manufacturing method of the present invention, no package failure was generated immediately after dicing.

The characteristic evaluation results of Embodiments 25 to 36 are shown in Table 3.

TABLE 3

|  |  | Embodiment 25 | Embodiment 26 | Embodiment 27 | Embodiment 28 | Embodiment 29 | Embodiment 30 | Embodiment 31 | Embodiment 32 | Embodiment 33 | Embodiment 34 | Embodiment 35 | Embodiment 36 |
|---|---|---|---|---|---|---|---|---|---|---|---|---|---|
| Distance from chip end face (μm) | Stress cushioning layer | 100 | 100 | 100 | 100 | 100 | 100 | 100 | 100 | 150 | 150 | 150 | 150 |
|  | External protection film | 150 | 150 | 150 | 150 | 50 | 50 | 50 | 50 | 100 | 100 | 100 | 100 |
|  | Chip protection film | 150 | 150 | 150 | 150 | 50 | 50 | 50 | 50 | 50 | 50 | 50 | 50 |

TABLE 3-continued

| | Embodiment 25 | Embodiment 26 | Embodiment 27 | Embodiment 28 | Embodiment 29 | Embodiment 30 | Embodiment 31 | Embodiment 32 | Embodiment 33 | Embodiment 34 | Embodiment 35 | Embodiment 36 |
|---|---|---|---|---|---|---|---|---|---|---|---|---|
| Coefficient of elasticity E of stress cushioning layer (MPa) | 3000 | 1000 | 3000 | 400 | 3000 | 1000 | 3000 | 400 | 3000 | 1000 | 3000 | 400 |
| Thickness of stress cushioning layer (μm) | 100 | 20 | 20 | 100 | 100 | 20 | 20 | 100 | 100 | 20 | 20 | 100 |
| Package failure rate immediately after dicing (failure count/evaluation count) | 0/10 | — | — | — | 0/10 | — | — | — | 0/10 | — | — | — |
| Interface peeling-off failure after individual — Chip - stress cushioning layer | 0/10 | 0/10 | 0/10 | 0/10 | — | — | — | — | — | — | — | — |
| Chip - chip protection film | 0/10 | 0/10 | 0/10 | 0/10 | 0/10 | 0/10 | 0/10 | 0/10 | 0/10 | 0/10 | 0/10 | 0/10 |
| TC (failure count/evaluation count) — Stress cushioning layer - chip protection film | 0/10 | 0/10 | 0/10 | 0/10 | 0/10 | 0/10 | 0/10 | 0/10 | 0/10 | 0/10 | 0/10 | 0/10 |
| Stress cushioning layer - external protection film | — | — | — | — | 0/10 | 0/10 | 0/10 | 0/10 | 0/10 | 0/10 | 0/10 | 0/10 |
| External protection film - chip protection film | — | — | — | — | 4/10 | 4/10 | 4/10 | 4/10 | 0/10 | 0/10 | 0/10 | 0/10 |
| Chip - external protection film | — | — | — | — | — | — | — | — | — | — | — | — |
| Disconnection failure after mounting TC (failure count/evaluation count) | 0/10 | 8/10 | 10/10 | 0/10 | 0/10 | 8/10 | 10/10 | 0/10 | 0/10 | 8/10 | 10/10 | 0/10 |
| Wiring layer pattern failure on stress cushioning layer (failure count/evaluation count) | 9/40 | 0/40 | 10/40 | 0/40 | 9/40 | 0/40 | 10/40 | 0/40 | 8/40 | 0/40 | 9/40 | 0/40 |

[Embodiment 26]

A semiconductor apparatus was prepared by the same method as that of Embodiment 25. In this case, a stress cushioning layer was formed by adhering an uncured dry film with a thickness of 20 μm, composed of epoxy resin, orthocresol novolac type curing agent, acrylic resin, polyamide-imide resin, and silica filler, which has a coefficient of elasticity of 1000 MPa at room temperature after curing at 180° C. using a roll laminator, and then heating and curing it at 250° C. for one hour. The same characteristic evaluation as that of Embodiment 25 was performed.

In this embodiment, in which the end of the chip protection film 8 is formed on the inside of the chip end face, the interface between the semiconductor chip 7 and the chip protection film 8 did not peel off. Since the end of the external protection film 5 is formed on the inside of the end of the stress cushioning layer 3, no peeling-off failure was generated in the interface between the stress cushioning layer 3 and the external protection film 5. Furthermore, since the end of the chip protection film 8 is formed on the inside of the stress cushioning layer 3, no peeling-off failure was generated in the interface between the stress cushioning layer 3 and the chip protection film 8 and the interface between the semiconductor chip 7 and the chip protection film 8.

[Embodiment 27]

A semiconductor apparatus was prepared by the same method as that of Embodiment 25. In this case, a stress cushioning layer was formed by adhering an uncured dry film with a thickness of 20 μm, including epoxy resin, orthocresol novolac type curing agent, acrylic resin, polyamide-imide resin, and silica filler, which has a coefficient of elasticity of 3000 MPa at room temperature after curing at 180° C. using a roll laminator, and then heating and curing it at 250° C. for one hour. The same characteristic evaluation as that of Embodiment 25 was performed.

In this embodiment, no peeling-off failure was generated in the interface between the semiconductor chip 7 and the chip protection film 8 and the interface between the stress cushioning layer 3 and the external protection film 5. Furthermore, since the end of the chip protection film 8 is formed on the inside of the stress cushioning layer 3, no peeling-off failure was generated in the interface between the stress cushioning layer 3 and the chip protection film 8 and the interface between the semiconductor chip 7 and the chip protection film 8.

[Embodiment 28]

A semiconductor apparatus was prepared by the same method as that of Embodiment 25. In this case, a stress cushioning layer was formed by adhering an uncured dry film with a thickness of 100 μm, including epoxy resin, orthocresol novolac type curing agent, acrylic resin, polyamide-imide resin, and silica filler, which has a coefficient of elasticity of 400 MPa at room temperature after curing at 180° C. using a roll laminator, and then heating and curing it at 250° C. for one hour. The same characteristic evaluation as that of Embodiment 25 was performed.

In this embodiment, no peeling-off failure was generated in the interface between the semiconductor chip 7 and the chip protection film 8 and the interface between the stress cushioning layer 3 and the external protection film 5. Furthermore, since the end of the chip protection film 8 is formed on the inside of the stress cushioning layer 3, no peeling-off failure was generated in the interface between the stress cushioning layer 3 and the chip protection film 8 and the interface between the semiconductor chip 7 and the chip protection film 8.

Since the coefficient of elasticity E (MPa) at room temperature and the thickness t (μm) satisfy the relationship between Formulas (1) and (2) mentioned above, wiring pattern failures caused by a warp of a semiconductor wafer were not generated. The cushioning effect of the stress cushioning layer is high, and disconnection failures at the time of temperature cycle after mounting were reduced.

[Embodiment 29]

Figure 8:
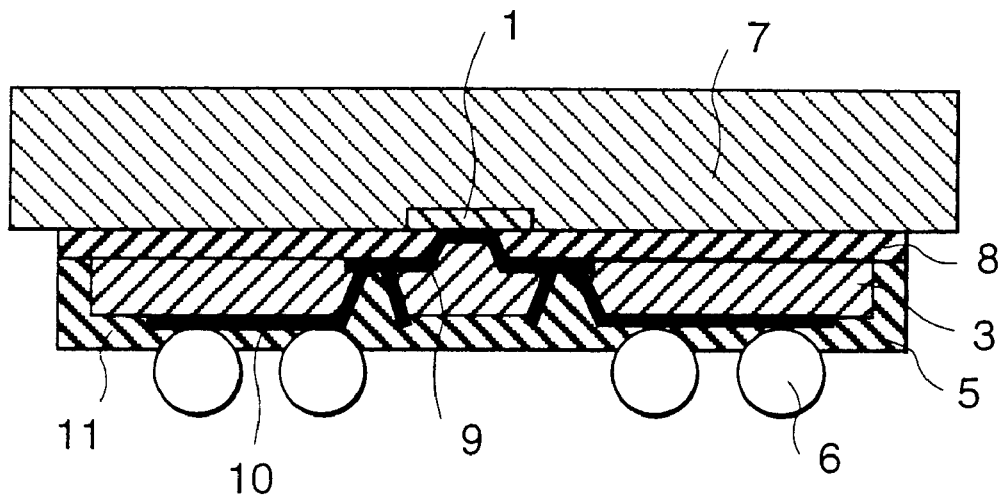
FIG. 8 is a cross sectional schematic view of a semiconductor apparatus representing yet a further example of the present invention.

FIG. 8 is a cross sectional view of another semiconductor apparatus of the present invention. This semiconductor apparatus was prepared by the following method.

The process until forming the first wiring layer 9 was the same as that of Embodiment 13.

Next, an uncured photosensitive dry film with a thickness of 100 $\mu$m, composed of epoxy resin, orthocresol novolac type curing agent, nitrite butadiene rubber, photo-oxidation agent, sensitizer, and silica filler, which has a coefficient of elasticity of 3000 MPa at room temperature after curing, was adhered at 90° C. using a roll laminator. Thereafter, in order to expose the land 10 of the first wiring layer and the scribe line, which is a cut line at dicing time, it was exposed using a predetermined mask, developed using an alkaline developer of semiwater system. It was additionally heated and cured at 180° C. for one hour, and the stress cushioning layer 3 was formed so that an opening with a hole diameter of 50 $\mu$m was formed in the land 10 of the first wiring layer and the end of the stress cushioning layer 3 was formed 100 $\mu$m inside the chip end face after dicing and 50 $\mu$m inside the chip protection film 8.

Next, in order to remove residues in the bier of the land 10 of the first wiring layer, a desmearing treatment is executed using a desmearing treatment liquid (MLB497, by Meltex Co., Ltd.) of the permanganate series. Next, the stress cushioning layer 3, with the opening and the linear slit formed therein, and the whole opening are sputter-etched by Ar so as to remove the Cu oxide film, and then Cr of 500 Å in thickness and additionally Cu of 0.5 $\mu$m in thickness were sputter-deposited. On the deposited film, a negative photosensitive resist (OFPR-N-3000, by Tokyo Oka Co., Ltd.) was spin-coated, and a resist wiring pattern with a thickness of 15 $\mu$m was formed by prebaking, exposure, and development.

Next, a Cu film with a thickness of 10 $\mu$m, was formed inside the wiring pattern obtained above by electroplating, and an Ni film with a thickness of 2 $\mu$m was formed on it by electroplating. The resist was peeled off using a release liquid (N-303C), and then Cu of the deposited film was etched by an ammonium persulfate/sulfuric acid solution, and additionally Cr was etched by a potassium permanganate solution, and a second wiring layer 11 was formed. At the stage of completion of this process, the failure rate of the second wiring pattern was evaluated.

Next, photosensitive solder resist varnish (SR9000, by Hitachi Kasei) was coated by a screen print process, dried at 80° C. for 20 minutes, exposed and developed using a predetermined pattern, and cured at 150° C. for one hour. Then, on the wiring layer, an external protection film 5 having an opening for connecting an external electrode, covering the end face of the stress cushioning layer, and having an end on the same position as that of the chip protection film 8 50 $\mu$m inside the chip end face after dicing was formed.

Next, on the Ni surface of the exposed part of the wiring layer 3, an Au film with a thickness of 0.1 $\mu$m was formed by substitution plating. On the Au plated wiring exposed part, flux (Delta flux 533, by Senju Kinzoku) was coated using a metal mask, and Sn—Ag—Cu series solder balls with a diameter of 0.35 mm were put on it and heated at 260° C. for 10 seconds using an infrared reflow furnace, whereby external electrodes 6 were formed. Finally, the scribe line was cut by a dicing saw with a thickness of 0.2 mm, so that individual semiconductor chips were separated, whereby a semiconductor apparatus of the present invention is prepared.

As a result of inspection of the appearance of the aforementioned semiconductor apparatus immediately after dicing, it was found that package failures, such as peeling-off of the semiconductor apparatus during dicing, were not generated. Furthermore, using the semiconductor apparatus, the same temperature cycle test as mentioned above and the temperature cycle test after it is mounted on a mounting substrate were executed 1000 times, and then an electrical continuity test was executed. In this embodiment, no peeling-off failure was generated in the interface between the semiconductor chip 7 and the chip protection film 8 and the interface between the stress cushioning layer 3 and the chip protection film 8. By the semiconductor apparatus manufacturing method of the present invention, no package failure was generated immediately after dicing.

[Embodiment 30]

A semiconductor apparatus was prepared by the same method as that of Embodiment 29. In this case, the stress cushioning layer was formed by using an uncured photosensitive dry film with a thickness of 20 $\mu$m, including epoxy resin, orthocresol novolac type curing agent, nitrite butadiene rubber, photo-oxidation agent, sensitizer, and silica filler as dry film materials, which has a coefficient of elasticity of 1000 MPa at room temperature after curing. The same evaluation as that of Embodiment 29 was performed. In this embodiment, no peeling-off failure was generated in the interface between the semiconductor chip 7 and the chip protection film 8 and the interface between the stress cushioning layer 3 and the chip protection film 8.

[Embodiment 31]

A semiconductor apparatus was prepared by the same method as that of Embodiment 29. In this case, the stress cushioning layer was formed by using an uncured photosensitive dry film with a thickness of 20 $\mu$m, including epoxy resin, orthocresol novolac type curing agent, nitrite butadiene rubber, photo-oxidation agent, sensitizer, and silica filler as dry film materials, which has a coefficient of elasticity of 3000 MPa at room temperature after curing. The same evaluation as that of Embodiment 29 was performed.

In this embodiment of the present invention, in which the end of the chip protection film 8 is formed on the inside of the chip end face, the interface between the semiconductor chip 7 and the chip protection film 8 did not peel off. Furthermore, since the stress cushioning layer 3 is formed on the inside of the chip protection film 8, no peeling-off failure was generated in the interface between the stress cushioning layer 3 and the chip protection film 8.

[Embodiment 32]

A semiconductor apparatus was prepared by the same method as that of Embodiment 29. In this case, the stress cushioning layer was formed by using an uncured photosensitive dry film with a thickness of 100 $\mu$m, including epoxy resin, orthocresol novolac type curing agent, nitrite butadiene rubber, photo-oxidation agent, sensitizer, and silica filler as dry film materials, which has a coefficient of elasticity of 400 MPa at room temperature after curing. The same evaluation as that of Embodiment 29 was performed.

In this embodiment of the present invention, no peeling-off failure was generated in the interface between the semiconductor chip 7 and the chip protection film 8 and the interface between the stress cushioning layer 3 and the chip protection film 8. Furthermore, since the coefficient of elasticity E (MPa) at room temperature and thickness t ($\mu$m)

satisfy the relationship between Formulas (1) and (2) mentioned above, wiring pattern failures caused by a warp of a semiconductor wafer were not generated. The cushioning effect of the stress cushioning layer is high, and so disconnection failures at the time of temperature cycle after mounting were reduced.

[Embodiment 33]

Figure 9:
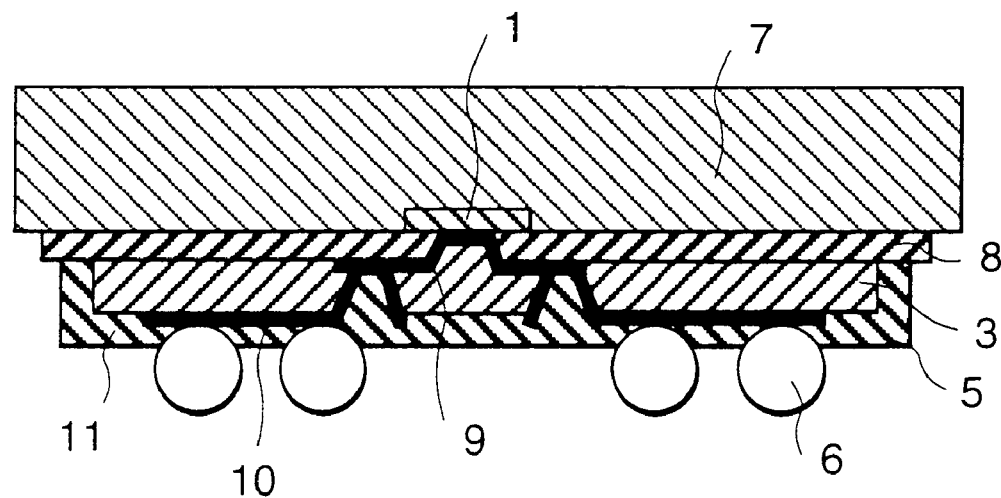
FIG. 9 is a cross sectional schematic view of a semiconductor apparatus representing yet a further example of the present invention.

FIG. 9 is a cross sectional view of another semiconductor apparatus of the present invention. This semiconductor apparatus was prepared by the following method.

The process until forming the first wiring layer 9 was the same as that of Embodiment 13.

Next, an uncured photosensitive dry film with a thickness of 100 μm, composed of epoxy resin, orthocresol novolac type curing agent, nitrite butadiene rubber, photo-oxidation agent, sensitizer, and silica filler, which has a coefficient of elasticity of 3000 MPa at room temperature after curing, was adhered at 90° C. using a roll laminator. Thereafter, in order to expose the land 10 of the first wiring layer and the scribe line, which is a cut line at dicing time, it was exposed using a predetermined mask, and developed using an alkaline developer of the semiwater system. It is additionally heated and cured at 180° C. for one hour and the stress cushioning layer 3 was formed so that an opening with a hole diameter of 50 μm was formed in the land 10 of the first. wiring layer, and the end of the stress cushioning layer 3 was formed 100 μm inside the chip end face after dicing and 50 Rm inside the chip protection film 8.

Next, in order to remove residues in the bier of the land 10 of the first wiring layer, a desmearing treatment was executed using a desmearing treatment liquid (MLB497, by Meltex Co., Ltd.) of the permanganate series. The stress cushioning layer 3, with the opening and the linear slit formed therein, and the whole opening were sputter-etched by Ar so as to remove the Cu oxide film, and then Cr of 500 Å in thickness and additionally Cu of 0.5 μm in thickness were sputter-deposited on the deposited film, a negative photosensitive resist (OFPR-N-3000, by Tokyo Oka Co., Ltd.) was spin-coated and a resist wiring pattern with a thickness of 15 μm was formed by prebaking, exposure, and development. Then, a Cu film with a thickness of 10 μm was formed inside the wiring pattern obtained above by electroplating, and an Ni film with a thickness of 2 μm was formed on it by electroplating. Next, the resist was peeled off using a release liquid (N-303C), and then the Cu deposited film was etched by an ammonium persulfate/sulfuric acid solution, and additionally Cr is etched by a potassium permanganate solution, whereby a second wiring layer 11 was formed. At the stage of completion of this process, the failure rate of the second wiring pattern was evaluated.

Next, photosensitive solder resist varnish (SR9000, by Hitachi Kasei) was coated by a screen print process, dried at 80° C. for 20 minutes, exposed and developed using a predetermined pattern, and cured at 150° C. for one hour. Then, on the wiring layer, an external protection film 5 having an opening for connecting an external electrode, covering the end face of the stress cushioning layer, and having an end in the position 100 μm inside the chip end face after dicing and 50 μm inside the chip protection film 8 was formed.

Next, on the Ni surface of the exposed part of the wiring layer 3, an Au film with a thickness of 0.1 μm was formed by substitution plating. On the Au plated wiring exposed part, flux (Delta flux 533, by Senju Kinzoku) was coated using a metal mask, and Sn—Ag—Cu series solder balls with a diameter of 0.35 mm were put on it and heated at 260° C. for 10 seconds using an infrared reflow furnace, whereby external electrodes 6 are formed. Finally, a scribe line was cut by a dicing saw with a thickness of 0.2 mm, so that individual semiconductor chips were separated, whereby a semiconductor apparatus of the present invention was prepared.

As a result of inspection of the appearance of the aforementioned semiconductor apparatus immediately after dicing, it was found that package failures, such as peeling-off of the semiconductor apparatus during dicing, were not generated.

Using the aforementioned semiconductor apparatus, the same temperature cycle test as mentioned above was executed 1000 times, and the sample was cut off, and the section was inspected. Furthermore, the semiconductor apparatus was mounted on a mounting substrate, and the temperature cycle test was executed 1000 times, and then an electrical continuity test was executed.

In this embodiment, no peeling-off failure was generated in the interface between the semiconductor chip 7 and the chip protection film 8 and the interface between the stress cushioning layer 3 and the chip protection film 8. The external protection film 5 was formed so as to cover the end of the stress cushioning layer 3 and no peeling-off failure was generated in the interface between the external protection film 5 and the stress cushioning layer 3. Furthermore, since the end of the external protection film 5 is formed on the inside of the end of the chip protection film 8, no peeling-off failure was generated in the interface between the chip protection film 8 and the external protection film 5. In the semiconductor apparatuses prepared by the manufacturing method of Comparison example 2, the appearance inspection immediately after dicing shows that interface peeling-off at the end of each semiconductor apparatus was generated in two of the 10 tested semiconductor apparatuses. However, by the semiconductor apparatus manufacturing method of the present invention, no package failure was generated immediately after dicing.

[Embodiment 34]

A semiconductor apparatus was prepared by the same method as that of Embodiment 33. In this case, the stress cushioning layer was formed by using an uncured photosensitive dry film with a thickness of 20 μm, including epoxy resin, orthocresol novolac type curing agent, nitrite butadiene rubber, photo-oxidation agent, sensitizer, and silica filler as dry film materials, which has a coefficient of elasticity of 1000 MPa at room temperature after curing. The same evaluation as that of Embodiment 33 was performed.

In this embodiment, no peeling-off failure was generated in the interface between the semiconductor chip 7 and the chip protection film 8 and the interface between the stress cushioning layer 3 and the chip protection film 8. The external protection film 5 was formed so as to cover the end of the stress cushioning layer 3, and no peeling-off failure was generated in the interface between the external protection film 5 and the stress cushioning layer 3. Furthermore, since the end of the external protection film 5 is formed on the inside of the end of the chip protection film 8, no peeling-off failure was generated in the interface between the chip protection film 8 and the external protection film 5.

[Embodiment 35]

A semiconductor apparatus was prepared by the same method as that of Embodiment 33. In this case, the stress cushioning layer was formed by using an uncured photosensitive dry film with a thickness of 20 μm, composed of epoxy resin, orthocresol novolac type curing agent, nitrite butadiene rubber, photo-oxidation agent, sensitizer, and silica filler as dry film materials, which has a coefficient of elasticity of 3000 MPa at room temperature after curing. The same evaluation as that of Embodiment 33 was performed.

In this embodiment of the present invention, no peeling-off failure was generated in the interface between the semiconductor chip 7 and the chip protection film 8 and the interface between the stress cushioning layer 3 and the chip protection film 8. The external protection film 5 was formed so as to cover the end of the stress cushioning layer 3, and so no peeling-off failure was generated in the interface between the external protection film 5 and the stress cushioning layer 3. Furthermore, since the end of the external protection film 5 is formed on the inside of the end of the chip protection film 8, no peeling-off failure was generated in the interface between the chip protection film 8 and the external protection film 5.

[Embodiment 36]

A semiconductor apparatus was prepared by the same method as that of Embodiment 33. In this case, the stress cushioning layer was formed by using an uncured photosensitive dry film with a thickness of 20 $\mu$m, including epoxy resin, orthocresol novolac type curing agent, nitrite-butadiene rubber, photo-oxidation agent, sensitizer, and silica filler as dry film materials, which has a coefficient of elasticity of 1000 MPa at room temperature after curing. The same evaluation as that of Embodiment 33 was performed.

In this embodiment, no peeling-off failure was generated in the interface between the semiconductor chip 7 and the chip protection film 8 and the interface between the stress cushioning layer 3 and the chip protection film 8. The external protection film 5 is formed so as to cover the end of the stress cushioning layer 3, and so no peeling-off failure was generated in the interface between the external protection film 5 and the stress cushioning layer 3. Furthermore, since the end of the external protection film 5 is formed on the inside of the end of the chip protection film 8, no peeling-off failure was generated in the interface between the chip protection film 8 and the external protection film 5.

Since the coefficient of elasticity E (MPa) at room temperature and thickness t ($\mu$n) satisfy the relationship between Formulas (1) and (2) mentioned above, wiring pattern failures caused by a warp of a semiconductor wafer were not generated. The cushioning effect of the stress cushioning layer is high, and so disconnection failures at the time of temperature cycle after mounting were further reduced.

[Embodiment 37]

Figure 10:
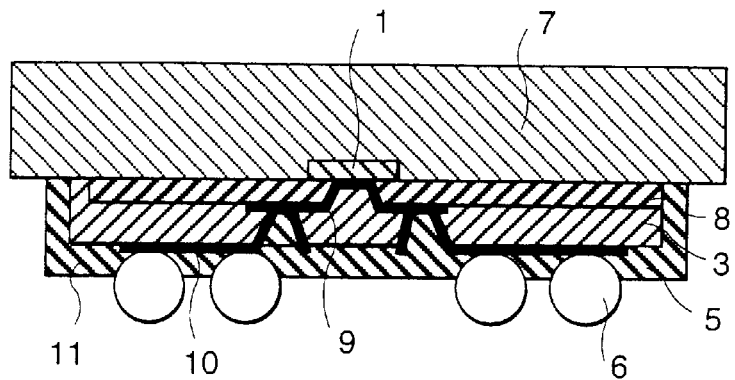
FIG. 10 is a cross sectional schematic view of a semiconductor apparatus representing yet a further example of the present invention.

FIG. 10 is a cross sectional view of a semiconductor apparatus of an embodiment of the present invention. The semiconductor apparatus of the present invention was prepared by the following method. The process until forming the first wiring layer 9 was the same as that of Embodiment 13.

Next, an uncured dry film with a thickness of 100 $\mu$m, including epoxy resin, orthocresol novolac type curing agent, acrylic resin, polyamide-imide resin, and silica filler, which has a coefficient of elasticity of 3000 MPa at room temperature after curing, was adhered at 1800 C. using a roll laminator. Then, it was heated and cured at 250° C. for one hour, whereby a stress cushioning layer 3 was formed. Next, in the stress cushioning layer, using a carbonic acid gas laser, an opening with a hole diameter of 50 $\mu$m and a 400-$\mu$m slit for exposing a 200-$\mu$m scribe line were formed. Next, in order to remove residues of laser processing of a land 10 of the first wiring layer, a desmearing treatment was executed using a desmearing treatment liquid (NLB497, by Meltex Co., Ltd.) of the permanganate series.

The stress cushioning layer 3, with the opening and the linear slit formed therein, and the whole opening were sputter-etched by Ar so as to remove the Cu oxide film, and then Cr of 500 Å in thickness and then Cu of 0.5 $\mu$m in thickness were sputter-deposited. On the deposited film, a negative photosensitive resist (OFPR-N-3000, by Tokyo Oka Co., Ltd.) was spin-coated and a resist wiring pattern with a thickness of 15 $\mu$m, is formed by prebaking, exposure, and development. Then, a Cu film with a thickness of 10 $\mu$m is formed inside the wiring pattern obtained above by electroplating, and an Ni film with a thickness of 2 $\mu$m was formed on it by electroplating.

Next, the resist was peeled off using a release liquid (N-303C), and then the Cu deposited film was etched by an ammonium persulfate/sulfuric acid solution, and additionally Cr was etched by a potassium permanganate solution, whereby a second wiring layer 11 was formed. At this stage, the failure rate of the second wiring pattern was evaluated.

Next, photosensitive solder resist varnish (SR9000, by Hitachi Kasei) was coated by a screen print process, dried at 80° C. for 20 minutes, exposed and developed using a predetermined pattern, and cured at 150° C. for one hour. Then, on the wiring layer, an external protection film 5 having an opening for connecting an external electrode, covering the end face of the stress cushioning layer, and having an end 50 $\mu$m inside the chip end face after dicing was formed.

Next, on the Ni surface of the exposed part of the wiring layer 3, an Au film with a thickness of 0.1 $\mu$m was formed by substitution plating. On the Au plated wiring exposed part, flux (Delta flux 533, by Senju Kinzoku) was coated using a metal mask, and Sn—Ag—Cu series solder balls with a diameter of 0.35 mm were put on it and heated at 260° C. for 10 seconds using an infrared reflow furnace, whereby external electrodes 6 were formed. Finally, a scribe line was cut by a dicing saw with a thickness of 0.2 mm, so that individual semiconductor chips were separated, whereby a semiconductor apparatus of the present invention was prepared.

As a result of inspection of the appearance of the aforementioned semiconductor apparatus immediately after dicing, it was found that package failures, such as peeling-off of the semiconductor apparatus during dicing, were not generated.

Furthermore, the same temperature cycle test as mentioned above was executed with 10 semiconductor apparatuses mentioned above, and the samples were cut off, and the sections are inspected. Furthermore, each of the semiconductor apparatus was mounted on a mounting substrate, and a mounting temperature cycle test was executed, and then an electrical continuity test was executed.

In this embodiment, since the external protection film 5 is formed on the inside of the chip end surface, no peeling-off failure was generated in the interface between the semiconductor chip 7 and the external protection film 5. In Comparison example 2, in which the semiconductor chip 7 and the chip protection film 8 were formed on the same surface, significant peeling-off was generated. On the other hand, since the external protection film 5 is formed so as to cover the end of the chip stress cushioning layer 3, no peeling-off failure was generated in the interface between the stress cushioning layer 3 and the external protection film 5 and the interface between the semiconductor chip 7 and the stress cushioning layer 3. Furthermore, since the end of the chip protection film 8 is formed on the inside of the end of the stress cushioning layer 3, no peeling-off was generated in the interface between the stress cushioning layer 3 and the chip protection film 8 and the interface between the semiconductor chip 7 and the chip protection film 8. In the semiconductor apparatuses prepared by the manufacturing method of Comparison example 2, the appearance inspection immediately after dicing shows that interface peeling-off at the end of each semiconductor apparatus was generated in two of the 10 tested semiconductor apparatuses. However, by the semiconductor apparatus manufacturing method of the present invention, no package failure was generated immediately after dicing.

The characteristic evaluation results of Embodiments 37 to 40 and Comparison examples 1 and 2 are shown in Table 4.

polyamide-imide resin, and silica filler, which has a coefficient of elasticity of 3000 MPa at room temperature after curing at 180° C. using a roll laminator. Then, it was heated and cured at 250° C. for one hour. The same characteristic evaluation as that of Embodiment 37 was performed.

In this embodiment, no peeling-off failure was generated in the interface between the semiconductor chip 7 and the external protection film 5, the interface between the stress cushioning layer 3 and the external protection film 5, and the interface between the semiconductor chip 7 and the stress cushioning layer 3. Furthermore, since the end of the chip protection film 8 is formed on the inside of the end of the stress cushioning layer 3, no peeling-off was generated in the interface between the stress cushioning layer 3 and the chip

TABLE 4

| | | Embodiment 37 | Embodiment 38 | Embodiment 39 | Embodiment 40 | Comparison example 1 | Comparison example 2 |
|---|---|---|---|---|---|---|---|
| Distance from chip end face (μm) | Stress cushioning layer | 100 | 100 | 100 | 100 | 0 | 0 |
| | External protection film | 150 | 50 | 50 | 50 | 0 | 0 |
| | Chip protection film | 150 | 150 | 150 | 150 | — | 0 |
| Coefficient of elasticity E of stress cushioning layer (MPa) | | 3000 | 1000 | 3000 | 400 | 3000 | 3000 |
| Thickness of stress cushioning layer (μm) | | 100 | 20 | 20 | 100 | 20 | 20 |
| Package failure rate immediately after dicing (failure count/evaluatian count) | | 0/10 | — | — | — | 2/10 | 3/10 |
| Interface peeling-off failure after individual TC (failure count/evaluation count) | Chip - stress cushioning layer | 0/10 | 0/10 | 0/10 | 0/10 | 8/10 | — |
| | Chip - chip protection film | 0/10 | 0/10 | 0/10 | 0/10 | — | 8/10 |
| | Stress cushioning layer - chip protection film | 0/10 | 0/10 | 0/10 | 0/10 | — | 4/10 |
| | Stress cushioning layer - external protection film | 0/10 | 0/10 | 0/10 | 0/10 | 4/10 | 3/10 |
| | External protection film - chip protection film | — | — | — | — | — | — |
| | Chip - external protection film | 0/10 | 0/10 | 0/10 | 0/10 | — | — |
| Disconnection failure after mounting TC (failure count/evaluation count) | | 0/10 | 8/10 | 10/10 | 0/10 | 10/10 | 10/10 |
| Wiring layer pattern failure on stress cushioning layer (failure count/evaluation count) | | 9/40 | 0/40 | 10/40 | 0/40 | 12/40 | 11/40 |

[Embodiment 38]

A semiconductor apparatus was prepared by the same method as that of Embodiment 37. In this case, a stress cushioning layer was formed by adhering an uncured dry film with a thickness of 20 μm including epoxy resin, orthocresol novolac type curing agent, acrylic resin, polyamide-imide resin, and silica filler, which has a coefficient of elasticity of 1000 MPa at room temperature after curing at 180° C. using a roll laminator, and then heating and curing it at 250° C. for one hour. The same characteristic evaluation as that of Embodiment 37 was performed.

In this embodiment, no peeling-off failure was generated in the interface between the semiconductor chip 7 and the external protection film 5, the interface between the stress cushioning layer 3 and the external protection film 5, and the interface between the semiconductor chip 7 and the stress cushioning layer 3.Furthermore, since the end of the chip protection film 8 is formed on the inside of the end of the stress cushioning layer 3, no peeling-off was generated in the interface between the stress cushioning layer 3 and the chip protection film 8 and the interface between the semiconductor chip 7 and the chip protection film 8.

[Embodiment 39]

A semiconductor apparatus was prepared by the same method as that of Embodiment 37. In this case, a stress cushioning layer was formed by adhering an uncured dry film with a thickness of 20 μm, composed of epoxy resin, orthocresol novolac type curing agent, acrylic resin, protection film 8 and the interface between the semiconductor chip 7 and the chip protection film 8.

[Embodiment 40]

A semiconductor apparatus was prepared by the same method as that of Embodiment 37. In this case, a stress cushioning layer was formed by adhering an uncured dry film with a thickness of 100 μm including epoxy resin, orthocresol novolac type curing agent, acrylic resin, polyamide-imide resin, and silica filler, which has a coefficient of elasticity of 400 MPa at room temperature after curing at 180° C. using a roll laminator and then heating and curing it at 250° C. for one hour. The same characteristic evaluation as that of Embodiment 37 was performed.

In this embodiment, no peeling-off failure was generated in the interface between the semiconductor chip 7 and the external protection film 5, the interface between the stress cushioning layer 3 and the external protection film 5, and the interface between the semiconductor chip 7 and the stress cushioning layer 3.Furthermore, since the end of the chip protection film 8 is formed on the inside of the end of the stress cushioning layer 3, no peeling-off was generated in the interface between the stress cushioning layer 3 and the chip protection film 8 and the interface between the semiconductor chip 7 and the chip protection film 8. Furthermore, since the coefficient of elasticity E (MPa) at room temperature and the thickness t (μn) satisfy the relationship between Formulas (1) and (2) mentioned above, wiring pattern failures caused by a warp of a semiconductor wafer were not generated. The cushioning effect of the stress cushioning layer is high, and so disconnection failures at the time of temperature cycle after mounting were reduced.

[Comparison example 1]

Figure 11:
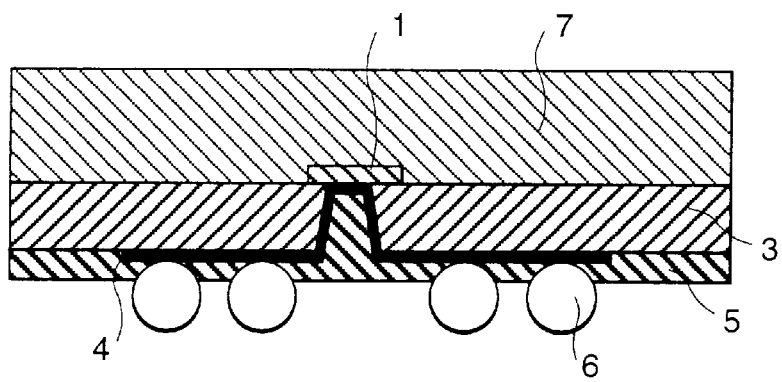
FIG. 11 is a cross sectional schematic view of a semiconductor apparatus representing a comparison example (conventional example).

FIG. 11 is a cross sectional view of a semiconductor apparatus of a comparison example. This semiconductor apparatus was prepared by the following method.

On the surface of a silicone semiconductor wafer, in which a plurality of semiconductor elements and an Al electrode 1 are formed on the surface, an uncured dry film with a thickness of 100 $\mu$m, including epoxy resin, orthocresol novolac type curing agent, acrylic rubber, and silica filler, which has a coefficient of elasticity of 3000 MPa at room temperature after curing, was adhered at 150° C. using a roll laminator. Then, it was heated and cured at 150° C. for one hour, whereby a stress cushioning layer 3 was formed.

Next, to expose the element electrode 2 on the chip, an opening with a hole diameter of 50 $\mu$m was formed in the element electrode using a carbonic acid gas laser. Next, in order to remove residues of the laser processing on the electrode and the oxide film on the surface of the Al electrode, oxygen plasma etching was executed. On the stress cushioning layer 3, with the opening formed therein, and the whole opening, Cr of 500 Å in thickness and then Cu of 0.5 $\mu$m in thickness were deposited. On the deposited film, a negative photosensitive resist (OFPR-N-3000, by Tokyo Oka Co., Ltd.) was spin-coated and a resist wiring pattern with a thickness of 15 $\mu$m was formed by prebaking, exposure, and development.

Next, a 10-$\mu$m Cu film is formed inside the wiring pattern by electroplating, and a 2-$\mu$m Ni film was formed on it by electroplating. Next, the resist was peeled off using a release liquid (N-303C), and then the Cu deposited film was etched by an ammonium persulfate/sulfuric acid solution, and additionally Cr was etched by a potassium permanganate solution, whereby a wiring layer 4 was formed. At the stage of completion of this process, the failure rate of the wiring pattern was evaluated.

Next, photosensitive solder resist varnish (SR9000, by Hitachi Kasei Kogyo Co., Ltd.) was coated by a screen print process, dried at 80° C. for 20 minutes, exposed and developed using a predetermined pattern, and cured at 150° C. for one hour; and, on the wiring layer, an external protection film 5 having an opening for connecting an external electrode was formed. Next, on the Ni surface of the exposed part of the wiring layer 3, an Au film with a thickness of 0.1 $\mu$m was formed by substitution plating. On the Au plated wiring exposed part, flux (belta flux 533, by Senju Kinzoku Co., Ltd.) was coated using a metal mask, and Sn—Ag—Cu series solder balls with a diameter of 0.35 mm were put on it and heated at 260° C. for 10 seconds using an infrared reflow furnace, whereby external electrodes 6 were formed. Finally, so as to form the ends of the semiconductor chip 7, the stress cushioning layer 3, and the external protection film 5 on the same surface, the individual semiconductor chips separated by a 0.2-mm dicing saw, whereby and the semiconductor apparatuses of the comparison example were prepared.

As a result of the appearance inspection of the aforementioned semiconductor apparatuses immediately after dicing, it was found that package failures of peeling-off at the end of each semiconductor apparatus during dicing were generated in two of the 10 semiconductor apparatuses.

Furthermore, a temperature cycle test was executed 1000 times using 10 semiconductor apparatuses mentioned above and the sample appearance was inspected. Furthermore, each of the semiconductor apparatuses was mounted on a mounting substrate, and the same temperature cycle test was executed 1000 times, and then an electrical continuity test was executed.

[Comparison example 2]

Figure 12:
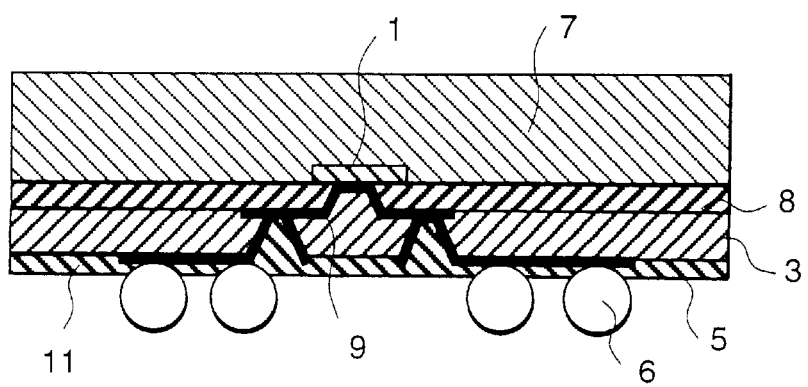
FIG. 12 is a cross sectional schematic view of a semiconductor apparatus representing another comparison example (conventional example).

FIG. 12 is a cross sectional view of a semiconductor apparatus of another comparison example. This semiconductor apparatus was prepared by the following method.

A negative photosensitive polyimide resin (PL3708, by Hitachi Kasei Kogyo Co., Ltd.) was spin-coated on the surface of a silicone semiconductor wafer having a plurality of semiconductor elements and an Al electrode 1 formed on the surface thereof. The coating was dried on a hot plate at 75° C. for 105 seconds and at 90° C. for 105 seconds, then exposed using a predetermined mask, heated again on the hot plate at 125° C. for 60 seconds, and then developed in a developer (PL Developer 2N, by Hitachi Kasei Kogyo Co., Ltd. ). Next, it was heated and cured in nitrogen at 350° C. for 60 seconds, whereby a chip protection film 8 that the electrode surface 1 was formed. Next, the Al oxide film on the surface of the element electrode 1 was removed by sputter etching using Ar and then Cr of 500 Å in thickness and additionally Cu of 0.5 $\mu$m in thickness were sputter-deposited on the chip protection film 8 and over all of the exposure part surface so as to form a film. On the deposited film, a negative photosensitive resist (OFPR-N-3000, by Tokyo Oka Co., Ltd.) was spin-coated and a resist wiring pattern with a thickness of 15 $\mu$m was formed by prebaking, exposure, and development. Next, a Cu film with a thickness of 10 $\mu$m was formed inside the aforementioned wiring pattern by electroplating and a first wiring layer 9 was formed.

Next, an uncured dry film with a thickness of 100 $\mu$m, including epoxy resin, orthocresol novolac type curing agent, acrylic resin, polyamide-imide resin, and silica filler, which has a coefficient of elasticity of 3000 MPa at room temperature after curing was adhered at 180° C. using a roll laminator, and then heated and cured at 250° C. for one hour, whereby a stress cushioning layer 3 was formed. Next, to expose the land 10 of the first wiring layer, an opening with a hole diameter of 50 $\mu$m was formed in the land 10 of the first wiring layer using a carbonic acid gas laser.

Next, in order to remove residues of the laser processing of the land 10 of the first wiring layer, a desmearing treatment was executed using a desmearing treatment liquid (MLB497, by Meltex Co., Ltd.) of the permanganate series. Next, the stress cushioning layer 3, with the opening formed therein, and the whole opening were sputter-etched by Ar so as to remove the Cu oxide film, and then Cr of 500 Å in thickness and additionally Cu of 0.5 $\mu$m in thickness were sputter-deposited. On the deposited film, a negative photosensitive resist (OFPR-N-3000, by Tokyo Oka Co., Ltd.) was spin-coated and a resist wiring pattern with a thickness of 15 $\mu$m was formed by prebaking, exposure, and development.

Next, a Cu film with a thickness of 10 $\mu$m was formed inside the wiring pattern obtained above by electroplating, and an Ni film With a thickness of 2 $\mu$m was formed on it by electroplating. Next, the resist was peeled off using a release liquid (N-303C), and then the Cu deposited film was etched by an ammonium persulfate/sulfuric acid solution, and additionally Cr was etched by a potassium permanganate solution, whereby a second wiring layer 11 was formed. At the stage of completion of this process, the failure rate of the second wiring pattern was evaluated.

Next, photosensitive solder resist varnish (SR9000, by Hitachi Kasei) was coated by a screen print process, dried at 80° C. for 20 minutes, exposed and developed using a predetermined pattern, and cured at 150° C. for one hour, and on the wiring layer, an external protection film 5 having an opening for connecting an external electrode was formed. Next, on the Ni surface of the exposed part of the wiring layer 3, an Au film with a thickness of 0.1 μm was formed by substitution plating. On the Au plated wiring exposed part, flux (Delta flux 533, by Senju Kinzoku) was coated using a metal mask, and Sn—Ag—Cu series solder balls with a diameter of 0.35 mm were put on it and heated at 260° C. for 10 seconds using an infrared reflow furnace, whereby external electrodes 6 were formed. Finally, a scribe line was cut by a dicing saw with a thickness of 0.2 mm, so that individual semiconductor chips were separated, whereby a semiconductor apparatus of the present invention was prepared.

As a result of the appearance inspection of the aforementioned semiconductor apparatuses immediately after dicing, it was found that package failures of peeling-off at the end of each semiconductor apparatus during dicing were generated in three of the 10 semiconductor apparatuses.

Furthermore, a temperature cycle test was executed 1000 times using 10 semiconductor apparatuses mentioned above, and the sample appearance was inspected, and an electrical continuity test, with each of the semiconductor apparatuses being mounted on a mounting substrate, was executed.

When the semiconductor apparatuses of the aforementioned embodiments were compared with the semiconductor apparatuses of Comparison examples 1 and 2, by forming the end of the stress cushioning layer or chip protection film on the inside of the end of the semiconductor chip, no peeling-off was generated in the interface between the semiconductor chip and the stress cushioning layer and the interface between the semiconductor chip and the chip protection film after the temperature cycle of each semiconductor apparatus. Furthermore, package failures immediately after dicing were further reduced in comparison to those produced by the semiconductor apparatus manufacturing method of Comparison examples 1 and 2.

The present invention can suppress centralization of thermal stress during mounting of packages and suppress mechanical stress during dicing of chips. Therefore, the present invention can provide a method of manufacturing semiconductor apparatuses of high reliability at a high manufacturing yield rate in which little peeling-off is generated in the chips and the resin layers.

What is claimed is:

1. A semiconductor apparatus characterized in that said semiconductor apparatus has, on a surface of a semiconductor chip with a circuit and an electrode formed, a stress cushioning layer except a part of said electrode, a wiring layer connected to said electrode on a part of said stress cushioning layer, an external protection film on said wiring layer and said stress cushioning layer, a window where a part of said wiring layer is exposed at a predetermined location of said external protection film, and an external electrode which is electrically connected to said wiring layer via said window, wherein said stress cushioning layer, said wiring layer, said conductor, said external protection film, and said external electrode are formed inside an end of said semiconductor chip.

2. A semiconductor apparatus according to claim 1, wherein said external protection film is formed inside an end of said stress cushioning layer.

3. A semiconductor apparatus according to claim 1, wherein an end of said external protection film is formed outside an end of said stress cushioning layer.

4. A semiconductor apparatus according to any of claims 1, 2, and 3, wherein a coefficient of elasticity E (MPa) at room temperature and a thickness t (μm) of said stress cushioning layer satisfy relationship of following Formulas (1) and (2):

$$\log(t) \geq 0.988 \log(E) - 1.515 \tag{1}$$

$$\log(t) \leq -1.063 \log(E) + 4.839 \tag{2}$$

5. A semiconductor apparatus characterized in that said semiconductor apparatus has, on a surface of a semiconductor chip with a circuit and an electrode formed, a chip protection film except a part of said electrode, a first wiring layer and a stress cushioning layer connected to said electrode on said chip protection film, a second wiring layer connected to said first wiring layer on said stress cushioning layer, an external protection film on said second wiring layer and said stress cushioning layer, a window where a part of said wiring layer is exposed at a predetermined location of said external protection film, and an external electrode which is electrically connected to said wiring layer via said window, wherein said chip protection layer, said stress cushioning layer, said wiring layer, said external protection film, and said external electrode are formed inside an end of said semiconductor chip.

6. A semiconductor apparatus according to claim 5, wherein said external protection film is formed inside an end of said stress cushioning layer.

7. A semiconductor apparatus according to claim 5, wherein an end of said external protection film is formed outside an end of said stress cushioning layer.

8. A semiconductor apparatus according to claim 6, wherein an end of said chip protection film is formed outside said end of said stress cushioning layer.

9. A semiconductor apparatus according to claim 6, wherein said chip protection film is formed inside said end of said stress cushioning layer.

10. A semiconductor apparatus according to claim 7, wherein an end of said chip protection film is formed outside said end of said external protection film.

11. A semiconductor apparatus according to claim 7, wherein an end of said chip protection film is formed inside said end of said external protection film.

12. A semiconductor apparatus according to any of claims 5 to 11, wherein a coefficient of elasticity E (MPa) and a thickness t (μm) of said stress cushioning layer satisfy relationship of following Formulas (1) and (2):

$$\log(t) \geq 0.988 \log(E) - 1.515 \tag{1}$$

$$\log(t) \leq -1.063 \log(E) + 4.839 \tag{2}$$

13. A semiconductor apparatus manufacturing method, comprising:

1. a step of forming a stress cushioning layer on a circuit forming surface of a semiconductor wafer on which a plurality of semiconductor elements are formed, 2. a step of forming an opening for exposing an electrode of said chip on said stress cushioning layer on said electrode of said semiconductor wafer, 3. a step of forming a slit in said stress cushioning layer on a scribe line for cutting said semiconductor wafer, 4. a step of forming a wiring layer connected to said electrode of said semiconductor chip on said stress cushioning layer via said opening, 5. a step of forming an external protection film having a window for connecting an external electrode on said stress cushioning layer and said wiring layer except said scribe line, 6. a step of forming an external electrode, and 7. a step of cutting said semiconductor wafer in a minimum unit for semiconductor apparatuses obtained after cutting to operate.

14. A semiconductor apparatus manufacturing method according to claim 13, comprising, instead of Step 5, 5(a), a step of forming a window for connecting an external electrode and an external protection film having an end inside an end of said stress cushioning layer on said stress cushioning layer and said wiring layer.

15. A semiconductor apparatus manufacturing method according to claim 13, comprising, instead of Step 5, 5(b), a step of forming a window for connecting an external electrode and an external protection film having an end between said scribe line and an end of said stress cushioning layer on said stress cushioning layer and said wiring layer.

16. A semiconductor apparatus manufacturing method, comprising:

- a step of forming a chip protection film on a circuit forming surface except an electrode of a semiconductor wafer on which a plurality of semiconductor elements are formed and a scribe line for cutting said semiconductor wafer,
- a step of forming a first wiring layer electrically connected to said electrode on said chip protection film,
- a step of forming a stress cushioning layer on said chip protection film and said first wiring layer,
- a step of forming an opening for exposing a part of said wiring layer on said stress cushioning layer,
- a step of forming a slit in said stress cushioning layer on said scribe line,
- a step of forming a second wiring layer connected to a part of said first wiring layer on said stress cushioning layer via said opening formed in said stress cushioning layer,
- a step of forming an external protection film having a window for connecting an external electrode on said stress cushioning layer and said wiring layer except said scribe line,
- a step of forming an external electrode, and
- a step of cutting said semiconductor wafer in a minimum unit for semiconductor apparatuses obtained after cutting to operate.

17. A semiconductor apparatus manufacturing method according to claim 16, comprising, instead of Step 7, 7(a), a step of forming a window for connecting an external electrode and an external protection film having an end inside an end of said stress cushioning layer on said stress cushioning layer and said second wiring layer.

18. A semiconductor apparatus manufacturing method according to claim 16, comprising, after Step 1 and Step 2:

3. a step of forming a stress cushioning layer having an end inside an end of said chip protection film on said chip protection film and said first wiring layer, 4. a step of forming an opening for exposing a part of said first wiring layer on said stress cushioning layer, 5. a step of forming a second wiring layer connected to a part of said first wiring layer on said stress cushioning layer via said opening formed in said stress cushioning layer, 6. a step of forming a window for connecting an external electrode and an external protection film having an end inside an end of said stress cushioning layer on said stress cushioning layer and said second wiring layer, 7. a step of forming an external electrode, and 8. a step of cutting said semiconductor wafer in a minimum unit for semiconductor apparatuses obtained after cutting to operate.

19. A semiconductor apparatus manufacturing method according to claim 16, comprising, after Step 1 and Step 2:

3. a step of forming a stress cushioning layer on said chip protection film and said first wiring layer, 4. a step of forming an opening for exposing a part of said wiring layer on said stress cushioning layer, 5. a step of forming a slit so that and end of said stress cushioning layer is formed between said scribe line and an end of said chip protection film, 6. a step of forming a second wiring layer connected to a part of said first wiring layer on said stress cushioning layer via said opening formed in said stress cushioning layer, 7. a step of forming a window for connecting an external electrode and an external protection film having an end inside said end of said stress cushioning layer on said stress cushioning layer and said second wiring layer, 8. a step of forming an external electrode, and 9. a step of cutting said semiconductor wafer in a minimum unit for semiconductor apparatuses obtained after cutting to operate.

20. A semiconductor apparatus manufacturing method according to claim 16, comprising, after Step 1 and Step 2:

3. a step of forming a stress cushioning layer having an end inside an end of said chip protection film on said chip protection film and said first wiring layer, 4. a step of forming an opening for exposing a part of said first wiring layer on said stress cushioning layer, 5. a step of forming a second wiring layer connected to a part of said first wiring layer on said stress cushioning layer via said opening formed in said stress cushioning layer, 6. a step of forming a window for connecting an external electrode and an external protection film having an end on a same surface as that of said end of said chip protection film on said stress cushioning layer and said second wiring layer, 7. a step of forming an external electrode, and 8. a step of cutting said semiconductor wafer in a minimum unit for semiconductor apparatuses obtained after cutting to operate.

21. A semiconductor apparatus manufacturing method according to claim 16, comprising, after Step 1 and Step 2:

3. a step of forming a stress cushioning layer having an end inside an end of said chip protection film on said chip protection film and said first wiring layer, 4. a step of forming an opening for exposing a part of said first wiring layer on said stress cushioning layer,
5. a step of forming a second wiring layer connected to a part of said first wiring layer on said stress cushioning layer via said opening formed in said stress cushioning layer,
6. a step of forming a window for connecting an external electrode and an external protection film having an end between said end of said chip protection film and said end of said stress cushioning layer on said stress cushioning layer and said second wiring layer,
7. a step of forming an external electrode, and
8. a step of cutting said semiconductor wafer in a minimum unit for semiconductor apparatuses obtained after cutting to operate.

22. A semiconductor apparatus manufacturing method according to claim 16, comprising, after Step 1 and Step 2:

3. a step of forming a stress cushioning layer on said chip protection film and said first wiring layer,
4. a step of forming an opening for exposing a part of said wiring layer on said stress cushioning layer,
5. a step of forming a stress cushioning layer having an end between said scribe line and an end of said chip protection film,
6. a step of forming a second wiring layer connected to a part of said first wiring layer on said stress cushioning layer via said opening formed in said stress cushioning layer,
7. a step of forming a window for connecting an external electrode and an external protection film having an end between said end of said stress cushioning layer and said scribe line on said stress cushioning layer and said second wiring layer,
8. a step of forming an external electrode, and
9. a step of cutting the semiconductor wafer in a minimum unit for semiconductor apparatuses obtained after cutting to operate.

* * * * *